(12) United States Patent
Yano et al.

(10) Patent No.: US 11,901,174 B2
(45) Date of Patent: Feb. 13, 2024

(54) SUBSTRATE TREATMENT METHOD AND SUBSTRATE TREATMENT EQUIPMENT

(71) Applicant: ORGANO CORPORATION, Tokyo (JP)

(72) Inventors: Daisaku Yano, Tokyo (JP); Yukinari Yamashita, Tokyo (JP); Masami Murayama, Tokyo (JP); Koji Yamanaka, Tokyo (JP)

(73) Assignee: ORGANO CORPORATION, Tokyo (JP)

( * ) Notice: Subject to any disclaimer, the term of this patent is extended or adjusted under 35 U.S.C. 154(b) by 5 days.

(21) Appl. No.: 17/241,522

(22) Filed: Apr. 27, 2021

(65) Prior Publication Data
US 2021/0249259 A1 Aug. 12, 2021

Related U.S. Application Data

(63) Continuation of application No. 15/023,161, filed as application No. PCT/JP2014/074481 on Sep. 17, 2014, now Pat. No. 11,004,674.

(30) Foreign Application Priority Data

Sep. 25, 2013 (JP) .................................. 2013-198535
Sep. 25, 2013 (JP) .................................. 2013-198549
(Continued)

(51) Int. Cl.
*H01L 21/02* (2006.01)
*H01L 21/67* (2006.01)
(Continued)

(52) U.S. Cl.
CPC .......... *H01L 21/02068* (2013.01); *C02F 9/00* (2013.01); *C23G 1/24* (2013.01);
(Continued)

(58) Field of Classification Search
CPC ......... H01L 21/02068; H01L 21/02071; H01L 21/67017; H01L 21/67051; H01L 21/6708;
(Continued)

(56) References Cited

U.S. PATENT DOCUMENTS

| | | | |
|---|---|---|---|
| 5,720,869 | A | 2/1998 | Yamanaka et al. |
| 2003/0094610 | A1 | 5/2003 | Aoki et al. |
| 2011/0240601 | A1 | 10/2011 | Hashizume et al. |

FOREIGN PATENT DOCUMENTS

| | | |
|---|---|---|
| CN | 101140858 | 3/2008 |
| JP | 4-51521 | 2/1992 |

(Continued)

OTHER PUBLICATIONS

JP2010240642A—Machine translation (Year: 2010).*
(Continued)

*Primary Examiner* — Tinsae B Ayalew
(74) *Attorney, Agent, or Firm* — Greenblum & Bernstein, P.L.C.

(57) ABSTRACT

Provided are a substrate treatment method and a substrate treatment equipment enabling greater suppression of corrosion or oxidation of metal wiring exposed on a substrate surface. The present invention relates to a substrate treatment equipment having a treatment chamber wherein a substrate is disposed, and whereto a substrate treatment solution for treating the substrate is supplied. This equipment is provided with an inert gas filling mechanism for filling with an inert gas the interior of the treatment chamber wherein the substrate is disposed, and, near or inside the treatment chamber, a catalytic unit filled with a platinum-group metal catalyst wherethrough a hydrogen-dissolved water including hydrogen added to ultra-pure water is passed. Obtained by passing the hydrogen-dissolved water through the platinum-group metal catalyst, a hydrogen- (Continued)

dissolved treatment solution is supplied as the substrate treatment solution into the treatment chamber by the equipment.

1 Claim, 7 Drawing Sheets

(30) Foreign Application Priority Data

Oct. 1, 2013 (JP) .................................. 2013-206447
May 9, 2014 (JP) .................................. 2014-097459

(51) Int. Cl.
*C23G 5/00* (2006.01)
*C23G 1/24* (2006.01)
*C02F 9/00* (2023.01)
*C02F 1/20* (2023.01)

(52) U.S. Cl.
CPC .......... *C23G 5/00* (2013.01); *H01L 21/02071* (2013.01); *H01L 21/6708* (2013.01); *H01L 21/67017* (2013.01); *H01L 21/67051* (2013.01); *H01L 21/67086* (2013.01); *C02F 1/20* (2013.01)

(58) Field of Classification Search
CPC ........ H01L 21/67086; C02F 9/00; C02F 1/20; C23G 1/24; C23G 5/00
USPC ...................................................... 134/100.1
See application file for complete search history.

(56) References Cited

FOREIGN PATENT DOCUMENTS

| | | |
|---|---|---|
| JP | 2000-331978 | 11/2000 |
| JP | 2003-136077 | 5/2003 |
| JP | 2010-17633 | 1/2010 |
| JP | 2010-56218 | 3/2010 |
| JP | 2010-135810 | 6/2010 |
| JP | 2010-214321 | 9/2010 |
| JP | 2010-240641 | 10/2010 |
| JP | 2010-240642 | 10/2010 |

OTHER PUBLICATIONS

International Search Report issued in Patent Application No. PCT/JP2014/074481, dated Dec. 22, 2014.

Japanese Office Action with partial English Translation in respect to Japanese Application No. 2014-097459, dated Feb. 9, 2018.

* cited by examiner

SUBSTRATE TREATMENT METHOD AND
SUBSTRATE TREATMENT EQUIPMENT

CROSS REFERENCE TO RELATED
APPLICATIONS

This is a continuation application of U.S. patent application Ser. No. 15/023,161, filed Mar. 18, 2016, which is the U.S. National Phase under 35 U.S.C. § 371 of International Patent Application No. PCT/JP2014/074481, filed Sep. 17, 2014. The disclosure of each of the above-mentioned documents, including the specification, drawings, and claims, is incorporated herein by reference in its entirety.

TECHNICAL FIELD

The disclosure relates to a substrate treatment method and a substrate treatment equipment for treating a substrate. More particularly, the disclosure relates to a substrate treatment method and a substrate treatment equipment to be used for cleaning treatment, chemical treatment or immersion treatment of a circuit substrate. The substrates to be treated include, for example, a semiconductor wafer, a substrate for a liquid crystal display device, a substrate for a plasma display, a substrate for a field emission display, a substrate for an optical disk, a substrate for a magnetic disk, a substrate for a magneto-optical disk, a substrate for a photomask, and a ceramic substrate.

BACKGROUND ART

Market demand exists for semiconductor integrated circuit devices having higher integration and higher speed. In order to meet this demand, lower-resistance copper wiring has been used in place of conventionally-used aluminum wiring. By combining the copper wiring with a low dielectric constant insulating film (so-called low-k film: insulating film made of a material whose specific dielectric constant is lower than that of silicon oxide) to form multilayer wiring, an integrated circuit device that operates at an extremely high speed can be implemented.

In the manufacturing process of such an integrated circuit device, performing cleaning for the purpose of removing fine particles, organic substances, metals and a natural oxide film attached to a surface of a body to be treated, such as a wafer, a substrate or the like, to achieve and maintain high cleanliness is important for maintaining the product quality and enhancing the yield. For example, the cleaning is performed using a chemical solution such as a sulfuric acid/hydrogen peroxide mixture, a hydrofluoric acid solution or the like, and then rinsing with ultrapure water is carried out. In recent years, because of the miniaturization of semiconductor devices, the diversity of materials and complex processes, the number of cleaning times has been increased. For example, in the formation of the above-mentioned multilayer wiring, the following steps are repeated: forming metal wiring that is a first wiring layer on the substrate; covering the metal wiring with an insulating material; polishing a surface of the insulating material that covers the metal wiring by CMP until it becomes flat; forming metal wiring that is a second wiring layer on the surface; covering the metal wiring with an insulating material; and polishing a surface of the insulating material by CMP until it becomes flat. In such a process, substrate cleaning is carried out after each polishing step.

For production of the ultrapure water, generally, an ultrapure water production equipment including a pretreatment system, a primary pure water system, and a secondary pure water system (hereinafter, referred to as subsystem) is used. A role of each system in the ultrapure water production equipment is as follows. The pretreatment system corresponds to a step for removing suspended matters and colloid substances contained in raw water through, for example, coagulation settling and sand filtration. The primary pure water system corresponds to a step for obtaining primary pure water by removing, through the use of, for example, an ion-exchange resin and a reverse osmosis (RO) membrane, ionic components and organic components contained in the raw water from which the suspended matters and the like have been removed by the pretreatment system. The subsystem corresponds to, as shown in FIG. 1, a step for producing ultrapure water by further increasing purity of the primary pure water obtained by the primary pure water system through the use of a water passage line in which an ultraviolet oxidation equipment (UV), a membrane degasifier (MD), a non-regenerative ion-exchange equipment (e.g., cartridge polisher (CP)), a membrane separation equipment (e.g., ultrafiltration equipment (UF)) and the like are continuous.

When the ultrapure water thus obtained is used for the semiconductor substrate, following problems occur and countermeasures against the respective problems have been suggested.

If a concentration of dissolved oxygen in the cleaning water is high, a natural oxide film is formed on the wafer surface by the cleaning water. This may block precise control of a film thickness and a film quality of a gate oxide film, or increase a contact resistance of a contact hole, a via, a plug, or the like. In addition, wiring metal is exposed on the surface of the substrate after the polishing step in the formation process of the multilayer wiring. Since the wiring metal such as tungsten (W) or copper (Cu) is easily corroded by the oxygen dissolved in the water, the film thickness of the wiring may be reduced during the substrate cleaning in the ultrapure water. In addition, when removing resist residues on the substrate surface generated by the polishing using a polymer removal solution, the polymer removal solution contacts the air in a treatment chamber and the oxygen is dissolved in the polymer removal solution, so that the polymer removal solution having a high concentration of oxygen is supplied to the substrate. Also in this case, the metal film (copper film, tungsten film or the like) on the substrate is oxidized by the dissolved oxygen in the polymer removal solution, thereby causing deterioration in the performance of the integrated circuit device that is to be created from the substrate.

As a countermeasure, degassing processing is performed using the membrane degasifier (MD) adopted in the subsystem for the purpose of reducing the gas dissolved in the water. In addition, as disclosed in Patent Literature 1 or 2, a method of dissolving the inert gas or hydrogen gas in the degasified ultrapure water to reduce the oxygen dissolved in the water has been adopted. In Patent Literature 1, a method of replacing the atmosphere near the surface of the substrate to be treated with the inert gas has been also adopted.

In the above-mentioned subsystem, since the water is irradiated with ultraviolet rays to decompose/remove the organic substances in the water by the ultraviolet oxidation equipment, water molecules are also oxidized by the ultraviolet irradiation to generate hydrogen peroxide that is an oxidizer. This means that the ultrapure water includes hydrogen peroxide. When the semiconductor device having a gate electrode of high melting-point metal such as tungsten or the like is cleaned using the cleaning solution including the hydrogen peroxide, a chemical reaction between tungsten or the like and the hydrogen peroxide is catalytically progressed to dissolve tungsten or the like.

As a method for removing the hydrogen peroxide in the water, a technology to remove hydrogen peroxide in the water by a platinum-group metal catalyst, such as palladium (Pd), as described in Patent Literature 3, has been known. Also, Patent Literature 4 proposes a method for highly efficiently decomposing and removing the hydrogen peroxide from the water to be treated by bringing a catalyst prepared by supporting a platinum-group metal on a monolithic organic porous anion exchanger into contact with the water to be treated including the hydrogen peroxide. Also, Patent Literature 5 discloses a method of dissolving hydrogen in oxygen-dissolved water and bringing the hydrogen-dissolved water into contact with a catalyst prepared by supporting a platinum-group metal on a monolithic organic porous anion exchanger. In the method of Patent Literature 5, it is possible to produce the treatment water from which the dissolved hydrogen peroxide and oxygen have been highly efficiently removed.

CITATION LIST

Patent Literature

Patent Literature 1: JP 2010-56218A
Patent Literature 2: JP 2003-136077A
Patent Literature 3: JP 2010-17633A
Patent Literature 4: JP 2010-240641A
Patent Literature 5: JP 2010-240642A As a pattern size of the integrated circuit device is further miniaturized, the thickness of the wiring is also gradually thinned. Therefore, the little corrosion of the wiring may cause deterioration in the performance of the integrated circuit device.

Since it is impossible to dispose the substrate treatment equipment and the subsystem at adjacent positions due to a layout of a semiconductor manufacturing line, in many cases, a pipe for supplying the ultrapure water from the subsystem to the treatment chamber of the substrate treatment equipment extends for a long distance. In the semiconductor manufacturing line, a fluorine resin such as polyvinyl chloride (PVC), PFA, PTFE or the like having chemical resistance is generally used for the pipe.

However, the air (oxygen) may be introduced into the pipe through a joint or flange of the pipe. Also, the pipe made of the fluorine resin such as PFA, PTFE or the like has high oxygen permeability. For this reason, as described above, when producing the ultrapure water, even though the dissolved oxygen in water in the subsystem is reduced by a predetermined amount or more, the oxygen may be introduced into the pipe from an outside of the pipe during water supply to the substrate treatment chamber. When the oxygen is introduced into the pipe, the dissolved oxygen in water to be provided to the substrate becomes a predetermined amount or more, so that the metal wiring such as Cu exposed on the substrate surface is corroded (problem 1). That is, even though the oxygen is removed from the ultrapure water in the subsystem, the corrosion of the metal wiring such as Cu exposed on the surface of the body to be treated may not be completely suppressed in some cases.

Also, as the pattern size of the integrated circuit device is miniaturized, disconnection by force applied in a heat process or disconnection by an increase in current becomes problematic. For this reason, aluminum, copper or the like is used to wire the respective devices therebetween, and molybdenum, tungsten or the like is used on the substrate as a high melting-point metal for a gate electrode of a MOS-type device.

Since copper, molybdenum, tungsten or the like is easily corroded by the dissolved oxygen, it is thought that the dissolved oxygen in the treatment solution to be provided to the substrate for the purpose of cleaning or etching would be reduced as much as possible by the technologies disclosed in Patent Literatures 1 to 5.

However, the inventors found that when the substrate having copper, molybdenum, tungsten or the like exposed on the surface thereof is treated using the hydrogen-dissolved water from which the dissolved oxygen has been removed, the corrosion of molybdenum is not suppressed.

As described in embodiments of the description, the inventors found that molybdenum is corroded not only by the oxygen in the treatment solution but also by the hydrogen peroxide (10 to 50 µg/L) and is thus eluted. The inventors first found that the hydrogen peroxide is produced in water by the ultraviolet oxidation equipment in the ultrapure water production equipment (the subsystem) of FIG. 1, which causes the corrosion. In addition, the inventors found that when the oxygen is included in the treatment solution, if the oxygen and molybdenum contact each other, the hydrogen peroxide, which is a causative substance of the corrosion, is generated.

That is, when treating the substrate with the ultrapure water subjected to the ultraviolet irradiation, it may not be possible to completely suppress the corrosion of molybdenum and molybdenum compound exposed on the surface of the body to be treated even though the dissolved oxygen in the ultrapure water is removed (problem 2).

Also, the cleaning of the semiconductor silicon substrate becomes more important in a variety of processing for manufacturing the semiconductor device. For this reason, hydrofluoric acid is frequently used as a chemical solution exhibiting various cleanliness and functionalities such as removal of an oxide film, suppression of fine particle attachment, flatness of the wafer surface and the like. Also, the hydrofluoric acid is used for cleaning of an equipment member for which extremely high cleanliness is required. The reason is that the hydrofluoric acid (HF) has a special property of removing surface oxides from the substrate of silicon, silicon-germanium or the like to make a hydrophobic surface.

In general, the hydrofluoric acid is not used as it is a raw solution. As the cleaning chemical solution of the semiconductor substrate, dilute hydrofluoric acid (DHF) in which the hydrofluoric acid is diluted with the ultrapure water is used. The ultrapure water is produced by the above-mentioned ultrapure water production equipment, and the oxygen or hydrogen peroxide in the ultrapure water can be removed or reduced by the technologies disclosed in Patent Literatures 1, 2, 4, 5 and the like.

However, during a process of supplying the hydrofluoric acid in a chemical solution tank to a body to be treated, the concentration of oxygen or concentration of hydrogen peroxide in the hydrofluoric acid is not currently managed. Therefore, as the semiconductor device is highly developed, miniaturized and highly integrated, the dissolved oxygen or dissolved hydrogen peroxide in the hydrofluoric acid may unexpectedly cause the oxidation or corrosion (for example, the elution of Cu, tungsten, molybdenum or the like exposed on the substrate surface) upon the substrate treatment using the dilute hydrofluoric acid, thereby lowering the yield. Therefore, there are needs to reduce the concentration of dissolved oxygen or concentration of hydrogen peroxide in the hydrofluoric acid as much as possible (problem 3).

SUMMARY OF DISCLOSURE

It is therefore an object of the disclosure to provide a substrate treatment method and a substrate treatment equipment capable of further suppressing corrosion of a metal wiring exposed on a substrate surface, considering the problems 1 to 3.

An aspect of the disclosure relates to a substrate treatment method of disposing a substrate in a treatment chamber of a substrate treatment equipment and treating the substrate. The method includes providing a platinum-group metal catalyst near the treatment chamber or in the treatment chamber, filling the treatment chamber having the substrate disposed therein with an inert gas, supplying a hydrogen-dissolved treatment solution, which is to be obtained by passing a hydrogen-dissolved solution prepared by adding hydrogen to a solution to be treated through the platinum-group metal catalyst, into the treatment chamber filled with the inert gas, and treating the substrate by the hydrogen-dissolved treatment solution.

Another aspect of the disclosure relates to a substrate treatment equipment having a treatment chamber in which a substrate is to be disposed and to which a substrate treatment solution for treating the substrate is to be supplied. The substrate treatment equipment includes an inert gas filling mechanism configured to fill the treatment chamber having the substrate disposed therein with an inert gas, and a catalytic unit provided near the treatment chamber or in the treatment chamber and filled with a platinum-group metal catalyst through which a hydrogen-dissolved solution prepared by adding hydrogen to a solution to be treated is to be passed, wherein a hydrogen-dissolved treatment solution, which is obtained by passing the hydrogen-dissolved solution through the platinum-group metal catalyst, is supplied as the substrate treatment solution into the treatment chamber.

According to the aspects of the method and equipment, the treatment chamber is filled with the inert gas so that a concentration of oxygen gas in the treatment chamber is 2% or less, the hydrogen is added to the solution to be treated so that a concentration of dissolved hydrogen in the hydrogen-dissolved solution is 8 μg/L or higher, and a concentration of dissolved oxygen in the hydrogen-dissolved treatment solution is adjusted to 2 μg/L or less and the concentration of hydrogen peroxide in the hydrogen-dissolved treatment solution is adjusted to 2 μg/L or less by passing the hydrogen-dissolved solution through the platinum-group metal catalyst.

According to the disclosure, the hydrogen-dissolved treatment solution obtained by passing the hydrogen-dissolved solution (the concentration of dissolved hydrogen is 8 μg/L or higher) through the platinum-group metal catalyst disposed near the treatment chamber or in the treatment chamber is supplied into the treatment chamber and the treatment chamber is filled with the inert gas. Thereby, it is possible to treat a substrate to be treated by using the hydrogen-dissolved treatment solution of which the concentrations of oxygen and hydrogen peroxide are reduced to a predetermined value or less (the concentration of dissolved oxygen is 2 μg/L or less, the concentration of hydrogen peroxide is 2 μg/L or less), in the treatment chamber in which the concentration of oxygen gas on a surface of the substrate to be treated is reduced to a predetermined value (2%) or less. Therefore, it is possible to further suppress corrosion (oxidation or elution of metal) of a wiring exposed on the surface of the substrate to be treated, as compared to the substrate treatment equipment of the related art.

According to the other aspect, a dilute chemical solution may be prepared by mixing the hydrogen-dissolved treatment solution and a chemical solution in a pipe or in a tank for dilution. The dilute chemical solution prepared in the pipe or the tank for dilution is suppressed from contacting the air to increase the concentration of oxygen.

In the treatment chamber in which the concentration of oxygen gas on the surface of the substrate to be treated is reduced to the predetermined value (2%) or less, the hydrogen-dissolved treatment solution or the dilute chemical solution can be provided to the substrate. Therefore, it is possible to suppress or prevent the concentration of oxygen in the chemical solution from increasing due to the contact of the hydrogen-dissolved treatment solution or the dilute chemical solution with the air in the treatment chamber. That is, while maintaining the reduced state of the concentration of oxygen, it is possible to provide the hydrogen-dissolved treatment solution or the dilute chemical solution to the substrate.

According to the other aspect, a shield member having a surface facing the substrate is provided to shield an atmosphere of the substrate surface from a surrounding atmosphere. Thereby, it is possible to further suppress or prevent the concentration of oxygen in the atmosphere of the substrate surface from increasing.

In this case, it is also possible to suppress a using amount of the inert gas.

As the chemical solution, hydrofluoric acid (HF), hydrochloric acid (HCl), IPA (isopropyl alcohol), a mixed solution of hydrofluoric acid and IPA (isopropyl alcohol), ammonium fluoride ($NH_4F$), and ammonia ($NH_3$) may be exemplified. When using the hydrofluoric acid, dilute hydrofluoric acid (DHF) is produced by mixing (combining) a hydrofluoric acid raw solution and a catalytic treatment water in a predetermined ratio.

The substrate is a substrate of which a metal pattern is exposed on a surface thereof, and the metal pattern may be a metal wiring. The metal pattern may be a single film of copper, tungsten or other metal, or may be a multilayer film formed by stacking a plurality of metal films. As the multilayer film, a stacked film where a barrier metal film for diffusion prevention is formed on a surface of a copper film may be exemplified.

A representative example of the inert gas is a nitrogen gas. In addition, however, the inert gas such as argon gas, helium gas or the like may also be used.

According to another aspect, the inert gas is supplied to a tank configured to store therein the chemical solution or the above-mentioned tank for dilution, so that it is possible to suppress or prevent the concentration of oxygen in a solution in the tank from increasing. Therefore, it is possible to suppress or prevent the dilute chemical solution of which the concentration of oxygen has increased from being supplied into the treatment chamber.

In addition, a pipe to be coupled to the treatment chamber has a structure including an inner pipe through which a solution passes and an outer pipe configured to surround the inner pipe, and the inert gas is supplied to a space between the inner pipe and the outer pipe, so that it is possible to surround the inner pipe by the inert gas. Therefore, even when the inner pipe is formed of an oxygen permeable material such as a fluorine resin, for example, it is possible to reduce an amount of the oxygen to be introduced into the inner pipe via the inner pipe. Thereby, it is possible to suppress or prevent the oxygen from being dissolved in the solution flowing in the inner pipe to increase the concentration of oxygen in the solution. The outer pipe may be formed of PVC or a fluorine resin, for example.

As described above, according to the respective aspects of the disclosure, it is possible to further suppress the wiring exposed on the substrate surface from being corroded by the substrate treatment solution, as compared to the related art. Therefore, it is possible to provide the treatment technology of the substrate, which is difficult to deteriorate the performance of a manufactured integrated circuit device.

REFERENCE SIGNS LIST

Figure 1:
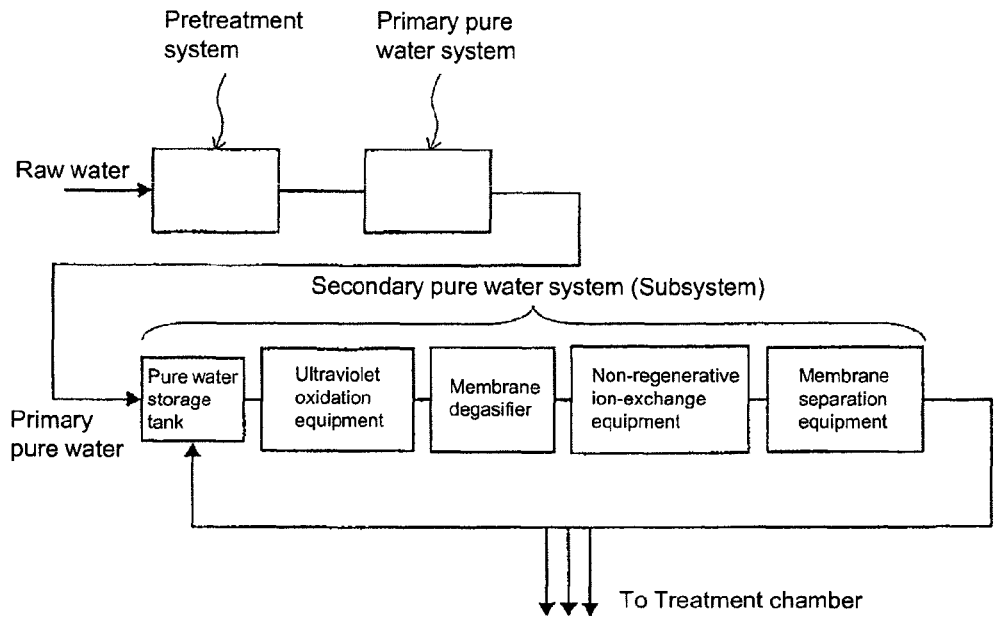
FIG. 1 is a schematic diagram depicting a general aspect of an ultrapure water production equipment.

W substrate
1 substrate treatment equipment
1a treatment solution inlet of substrate treatment equipment 1
2 treatment chamber
3 spin chuck
4, 4a treatment solution nozzle
5 control unit
6 sandwiching member
7 chuck rotation driving mechanism
8 spin base
9 subsystem of ultrapure water production equipment
9a ultrapure water (solution to be treated) circulation pipe of subsystem 9
9b outlet of ultrapure water (solution to be treated) circulation pipe of subsystem 9
10 main pipe
10a branch point
11 shield plate
18 gas valve
19 nozzle arm
20 support shaft
21 catalytic unit
22 membrane separation unit
23 drainpipe
24 drain valve
27 treatment solution supply pipe
28 treatment solution valve
31 support shaft
32 peripheral wall part
33 plain plate part
34 substrate facing surface
39 gas supply pipe
41 gas flow regulator valve
51 chemical solution preparation unit
52 mixing part
53 first chemical solution supply pipe
54 chemical solution valve
55 chemical solution flow regulator valve
56 chemical solution tank
57 pump
75 second chemical solution supply pipe
76 chemical solution valve
77 inert gas supply pipe
78 inert gas valve
79 chemical solution flow regulator valve
81 chemical solution preparation unit
82 chemical solution dilution tank
83 dilute chemical solution supply pipe
84 dilute chemical solution valve
85 second treatment solution supply pipe
86 treatment solution valve
87 treatment solution flow regulator valve
90 treatment solution supply pipe
91 treatment solution valve
100 pipe
101 inner pipe
102 outer pipe
103 inert gas valve
104 inert gas supply pipe
105 exhaust valve
106 inert gas exhaust pipe
201 treatment tank
202 overflow part
203 treatment solution nozzle
204 outlet
205 specific resistance meter
206, 207 drainpipe
208 drain valve
209 cover member
210 level sensor
211 exhaust gas valve
212 exhaust gas pipe
213 treatment solution valve
214 flowmeter
215, 216, 217 pipe for measurement
218 pH meter
219 conductivity meter
220 concentration meter of dissolved oxygen
221 inert gas seal chamber
222 inert gas introduction port
223 inert gas exhaust port
224 transparent tank
300 mixed water storage tank
301 HF supply line
302 ultrapure water supply line
303 treatment solution supply line
304 HF purification unit
305 hydrogen addition equipment 306 oxidant removal equipment
307 inert gas supply line

DESCRIPTION OF EMBODIMENTS

Hereinafter, embodiments of the disclosure will be described with reference to the drawings.

First Embodiment

Figure 2:
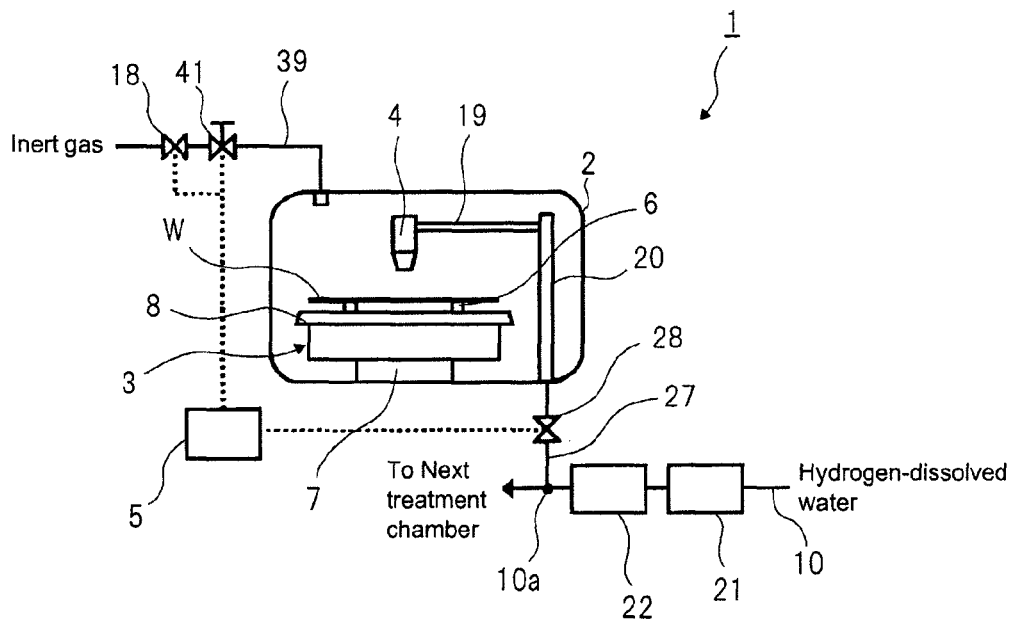
FIG. 2 depicts a schematic configuration of a substrate treatment equipment according to a first embodiment.

FIG. 2 depicts a schematic configuration of a substrate treatment equipment according to a first embodiment. A substrate treatment equipment 1 of the first embodiment is a single wafer treatment equipment configured to treat a substrate W one by one. In the first embodiment, the substrate W is a circular substrate, like a semiconductor wafer.

Referring to FIG. 2, the substrate treatment equipment 1 has one or more treatment chambers 2 partitioned by a partition wall. In each treatment chamber 2, a spin chuck 3 (a substrate holding mechanism, a substrate holding and rotating mechanism) configured to horizontally hold and rotate one substrate W, and a treatment solution nozzle 4 configured to supply a treatment solution to an upper surface of the substrate W held on the spin chuck 3 are provided.

The spin chuck 3 has a disc-shaped spin base 8 (holding base) horizontally attached to an upper end of a rotating shaft extending vertically, a plurality of sandwiching members 6 disposed on the spin base 8, and a chuck rotation driving mechanism 7 coupled to the rotating shaft. The spin base 8 is a disc-shaped member having a diameter greater than the substrate W, for example. An upper surface (a surface of the holding base) of the spin base 8 is a circular plane having a diameter greater than the substrate W.

The plurality of sandwiching members 6 can horizontally sandwich (hold) one substrate W on the upper surface of the spin base 8 in cooperation with each other.

The substrate W held by the sandwiching members 6 is rotated about a vertical rotating axis passing through a center thereof by a driving force of the chuck rotation driving mechanism 7.

The treatment solution nozzle 4 can discharge a treatment solution for cleaning or etching to the upper surface of the substrate W held at the spin chuck 3. The treatment solution nozzle 4 is attached to a tip of a nozzle arm 19 extending horizontally. The treatment solution nozzle 4 is disposed above the spin chuck 3 with a discharge port thereof facing downwards.

The nozzle arm 19 is coupled with a support shaft 20 extending in the vertical direction. The support shaft 20 is configured to swing about a central axis thereof. The support shaft 20 is coupled with a nozzle swing driving mechanism including a motor and the like, for example. By a driving force of the nozzle swing driving mechanism, the treatment solution nozzle 4 and the nozzle arm 19 are integrally moved in the horizontal direction around the central axis of the support shaft 20. Thereby, it is possible to dispose the treatment solution nozzle 4 above the substrate W held at the spin chuck 3 or to retreat the treatment solution nozzle 4 from the upper of the spin chuck 3. Also, while the substrate W is rotated by the spin chuck 3, it is possible to supply droplets of the treatment solution from the treatment solution nozzle 4 to the upper surface of the substrate W and to swing the treatment solution nozzle 4 within a predetermined angle range, thereby moving a supply position of the treatment solution to the upper surface of the substrate W.

The treatment solution nozzle 4 is connected with a treatment solution supply pipe 27 passing through the hollow nozzle arm 19 and the support shaft 20.

The treatment solution supply pipe 27 is interposed with a treatment solution valve 28 for switching supply and supply stop of the treatment solution to the treatment solution nozzle 4.

A gas supply pipe 39 is inserted into the treatment chamber 2. A nitrogen gas that is an example of the inert gas is supplied from the gas supply pipe 39 into the treatment chamber 2. Thereby, it is possible to replace the air in a space above the substrate W with the inert gas. For this reason, the inert gas is preferably supplied to the surrounding of the substrate W held at the spin chuck 3, more particularly, into a space between the treatment solution nozzle 4 and the spin chuck 3.

The gas supply pipe 39 is interposed with a gas valve 18 for switching supply and supply stop of the inert gas to the gap and a gas flow regulator valve 41 configured to regulate a supply flow rate of the inert gas to the gap.

The respective opening/closing operations of the treatment solution valve 28, the gas valve 18 and the gas flow regulator valve 41 are controlled by a control unit 5. In the meantime, a valve configured to perform the opening/closing operation and the flow rate regulation at the same time may be used in place of the gas valve 18 and the gas flow regulator valve 41.

Figure 3:
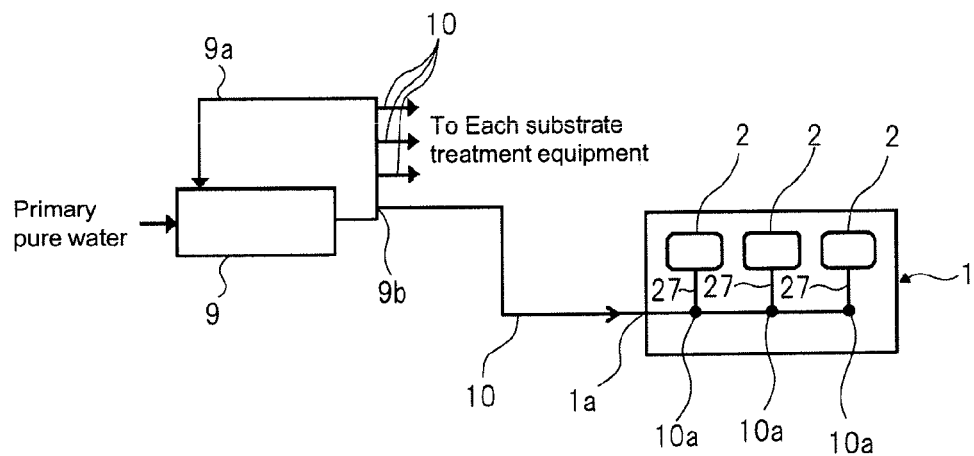
FIG. 3 depicts a pipe line configured to supply a treatment solution from a subsystem of FIG. 1 to a substrate treatment equipment of the disclosure.

Also, according to the disclosure, as shown in FIG. 3, ultrapure water (a solution to be treated) from a subsystem 9 (refer to FIG. 1) of an ultrapure water production equipment is supplied to each treatment chamber 2 (cleaning mechanism) of the substrate treatment equipment 1. An outlet 9b of an ultrapure water (the solution to be treated) circulation pipe 9a of the subsystem 9 and an ultrapure water (the solution to be treated) inlet 1a of each substrate treatment equipment 1 are connected via a main pipe 10 made of a fluorine resin such as PVC, PFA, PTFE or the like, which are mainly used for a semiconductor manufacturing line. Each main pipe 10 extends and is branched in each substrate treatment equipment 1, so that it is connected to the treatment solution supply pipe 27 configured to communicate with the treatment solution nozzle 4 of each treatment chamber 2 in the substrate treatment equipment 1. The treatment solution supply pipe 27 is also made of a fluorine resin such as PVC, PFA, PTFE or the like.

A catalytic unit 21 (refer to FIG. 2) is provided on the main pipe 10 in the vicinity of the ultrapure water inlet 1a of the substrate treatment equipment 1, and a membrane separation unit 22 (refer to FIG. 2) is provided on the main pipe 10 at the rear of the catalytic unit 21.

The ultrapure water (the solution to be treated) that is to be supplied from the main pipe 10 to the catalytic unit 21 is adjusted to a hydrogen-dissolved treatment solution in which a concentration of dissolved hydrogen is 8 µg/L or higher (preferably, 15 µg/L or higher, more preferably 66 µg/L or higher). The ultrapure water (the solution to be treated) that is to be supplied from the subsystem 9 to the main pipe 10 is hydrogen-dissolved water treated by a hydrogen dissolution treatment equipment (refer to FIG. 1) of the subsystem 9 and having a predetermined concentration of dissolved hydrogen. However, when the concentration of dissolved hydrogen in the hydrogen-dissolved water does not reach 8 µg/L or higher (preferably, 15 µg/L or higher, more preferably 66 µg/L or higher) at a position just before the catalytic unit 21 of FIG. 2, hydrogen is added to the hydrogen-dissolved water to adjust the concentration of dissolved hydrogen in the hydrogen-dissolved water to 8

μg/L or higher (preferably, 15 μg/L or higher, more preferably, 66 μg/L or higher). In this case, a hydrogen gas introduction equipment (not shown) is provided at a pipe part just before the catalytic unit 21.

The catalytic unit 21 has a platinum-group metal catalyst filled therein for reducing the concentration of dissolved oxygen to 2 μg/L or less and the concentration of hydrogen peroxide to 2 μg/L or less in the hydrogen-dissolved treatment solution obtained by passing the hydrogen-dissolved water through the catalytic unit 21. For example, a catalytic unit having a palladium catalyst filled therein or a catalytic unit having a palladium catalyst supported on a monolithic organic porous anion exchanger may be cited. The specific examples of the platinum-group metal catalyst will be described in more detail later (refer to a third embodiment).

In this embodiment, the catalytic unit 21 is positioned in the vicinity of the ultrapure water inlet 1a (refer to FIG. 3) of the substrate treatment equipment 1 on the main pipe 10. However, the disclosure is not limited thereto. That is, the catalytic unit 21 may be disposed near the treatment chamber 2 or in the treatment chamber 2.

In the meantime, the description 'near the treatment chamber' includes following some positions (first to fifth examples). As a first example, the catalytic unit 21 is provided on an ultrapure water (the solution to be treated) supply path between the outlet (branch port) 9b of the ultrapure water circulation pipe 9a of the subsystem 9 shown in FIG. 3 and an inlet of any treatment chamber 2. As a second example, the catalytic unit 21 is provided on an ultrapure water supply path between the outlet 9b of the ultrapure water circulation pipe 9a of the subsystem 9 and the ultrapure water inlet 1a of the substrate treatment equipment 1. As a third example, the catalytic unit 21 is provided on an ultrapure water supply path within 10 m (more preferably, within 5 m) upstream from the ultrapure water inlet 1a of the substrate treatment equipment 1. As a fourth example, the catalytic unit 21 is provided on an ultrapure water supply path between the ultrapure water inlet 1a of the substrate treatment equipment 1 and a first branch point 10a of the main pipe 10 facing each treatment chamber 2. As a fifth example, the catalytic unit 21 is provided for the treatment solution supply pipe 27 connected to each treatment chamber 2.

In addition, the catalytic unit 21 may be provided not only near the treatment chamber 2 but also in the treatment chamber 2. The description 'in the treatment chamber 2' includes following some positions. That is, the catalytic unit 21 may be disposed at any one of the hollow support shaft 20, the nozzle arm 19 and the treatment solution nozzle 4, which are the ultrapure water supply path in the treatment chamber 2 of FIG. 2.

Also, in this embodiment, as shown in FIG. 2, the membrane separation unit 22 is disposed at the pipe part between the catalytic unit 21 and the first branch point 10a but may be disposed at any position inasmuch as it is located at the rear of the catalytic unit 21. As the membrane separation unit 22, a microfiltration membrane (MF), an ultrafiltration membrane (UF) or a nano-filter (NF) may be used.

According to the aspect of the disclosure, following problems can be solved.

Even when the ultrapure water of which the dissolved oxygen has been reduced is produced by the subsystem 9, the air is introduced into the pipe or permeates the pipe from a joint or flange of the pipe while the ultrapure water is transported from the subsystem 9 to the substrate treatment equipment 1 through the long pipe, so that an amount of dissolved oxygen in the ultrapure water in the pipe increases. If the ultrapure water is used as the substrate treatment solution, a wiring exposed on a surface of a substrate to be treated is corroded (i.e., the metal is eluted or oxidized). In recent years, as a pattern size becomes smaller, a film thickness of the wiring made of copper, tungsten, molybdenum or the like becomes also thinner. Therefore, the little corrosion of the wiring may highly influence the performance of the semiconductor circuit device.

Considering the above problem, according to the aspect of the disclosure, the catalytic unit 21 is provided near the treatment chamber 2 or in the treatment chamber 2, and the mechanism (the gas supply pipe 39, the gas valve 18 and the like) configured to fill the treatment chamber 2 with the inert gas is provided. Thereby, by using the hydrogen-dissolved treatment solution of which the concentrations of oxygen and hydrogen peroxide have been reduced to the predetermined values or less, it is possible to treat a substrate to be treated in the treatment chamber 2 in which the concentration of oxygen gas on the surface of the substrate to be treated has been reduced to the predetermined value or less. For this reason, it is possible to further suppress the corrosion of the wiring exposed on the surface of the substrate to be treated, as compared to the substrate treatment equipment of the related art.

As the method of removing the oxygen from the ultrapure water, there is a method of using vacuum degassing (including membrane degassing). However, according to the vacuum degassing, since all gas components (nitrogen and the like) including oxygen are removed from the ultrapure water, the gas partial pressure is lowered, so that the external air is easily attracted into the ultrapure water. According to deoxidization by catalytic reduction, since only the dissolved oxygen is removed, variation in the gas partial pressure included in the ultrapure water is suppressed, so that it is possible to easily maintain the water quality.

In the meantime, the catalytic unit 21 is provided near the treatment chamber 2 or in the treatment chamber 2, and it has been described that the description 'near the treatment chamber or in the treatment chamber' physically includes the above-mentioned places. Describing the places by the functional expression, the description 'near the treatment chamber or in the treatment chamber' indicates a position of a treatment solution discharging part of the treatment chamber 2 at which the concentration of dissolved oxygen is 2 μg/L or less and the concentration of hydrogen peroxide is 2 μg/L or less.

Also, according to the disclosure, even though 'the membrane separation unit 22' is not provided, the above-mentioned problems can be solved. However, the membrane separation unit 22 is preferably provided at the rear of the catalytic unit 21 because it is possible to remove the fine particles from the substrate treatment solution to be supplied into the treatment chamber. Therefore, in the description, the aspect where the membrane separation unit 22 is provided at the rear of the catalytic unit 21 is exemplified.

<First Modified Aspect>

Figure 4:
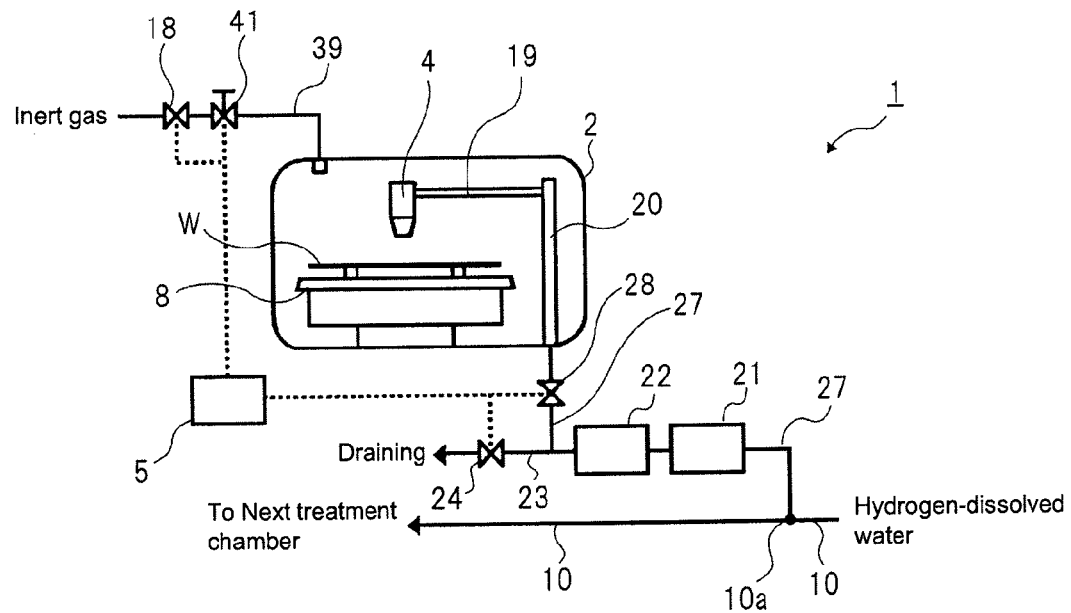
FIG. 4 depicts a first modified aspect of the substrate treatment equipment according to the first embodiment.

According to the aspect shown in FIG. 2, after removing the dissolved oxygen and the hydrogen peroxide from the hydrogen-dissolved water by using the unit including the catalytic unit 21 and the membrane separation unit 22, the hydrogen-dissolved treatment solution from which the dissolved oxygen and the hydrogen peroxide have been removed is sent to each treatment chamber 2. However, the disclosure can also adopt an aspect of FIG. 4. In the aspect of FIG. 4, the unit including the catalytic unit 21 and the membrane separation unit 22 is provided for each treatment solution supply pipe 27 disposed at each treatment chamber 2. According to this aspect, the unit including the catalytic unit 21 and the membrane separation unit 22 can be arranged closer to the treatment chamber 2, as compared to the aspect of FIG. 2. For this reason, the pipe from the membrane separation unit 22 of the unit to the treatment solution nozzle 4 of the treatment chamber 2 is also shortened, so that it is possible to further lower the probability that the oxygen will be included in the treatment solution to be discharged to the substrate in the treatment chamber 2.

In addition, according to the aspect of FIG. 4, a drainpipe 23 is connected to the pipe part from the membrane separation unit 22 to the treatment solution valve 28. The drainpipe 23 is interposed with a drain valve 24 for switching draining and draining stop. Opening and closing operations of the drain valve 24 are also controlled by the control unit 5. When the distance from the treatment solution nozzle 4 of the treatment chamber 2 to the catalytic unit 21 is shortened, like the aspect of FIG. 4, the hydrogen-dissolved treatment solution may be stagnant in the catalytic unit 21 while stopping the substrate treatment in the treatment chamber 2. In this case, the impurities may be eluted to the treatment solution supply pipe 27. For this reason, when the substrate treatment in the treatment chamber 2 is stopped for a predetermined time period or longer, the hydrogen-dissolved treatment solution in the treatment solution supply pipe 27 is drained (blown) through the drainpipe 23 and then a new hydrogen-dissolved treatment solution is supplied to the substrate W.

As another method of discharging the impurities eluted to the treatment solution supply pipe 27, a method of opening the treatment solution valve 28 with the treatment solution nozzle 4 being detached from the upper of the substrate W, and discharging the hydrogen-dissolved treatment solution being stagnant in the treatment solution supply pipe 27 may be used. In this case, the drainpipe 23 and the drain valve 24 are unnecessary.

<Second Modified Aspect>

In the aspect of FIG. 2, after removing the dissolved oxygen and the hydrogen peroxide from the hydrogen-dissolved water by using the unit including the catalytic unit 21 and the membrane separation unit 22, the hydrogen-dissolved treatment solution from which the dissolved oxygen and the hydrogen peroxide have been removed is sent to each treatment chamber 2. However, the disclosure can also adopt an aspect of FIG. 5. That is, according to this aspect, a dilute chemical solution is prepared by mixing a chemical solution with the hydrogen-dissolved treatment solution from which the dissolved oxygen and the hydrogen peroxide have been removed and is then supplied to the treatment solution nozzle 4. This aspect is effective when using a chemical solution that cannot be passed through the catalytic unit 21.

Figure 5:
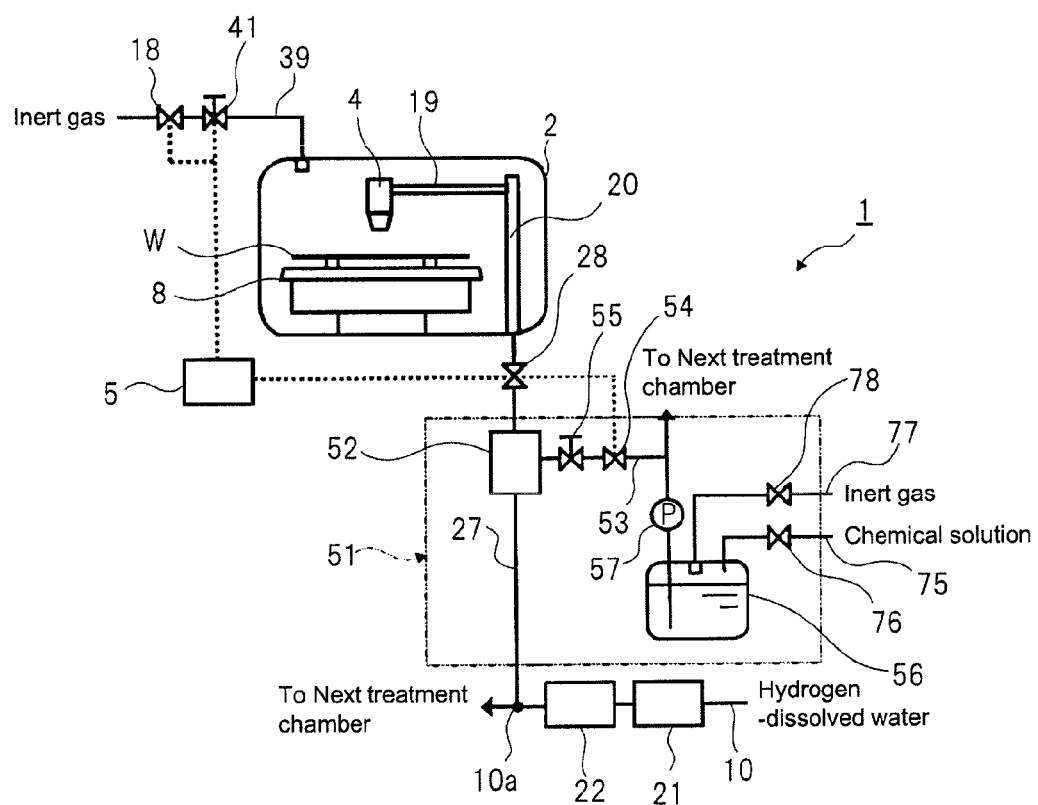
FIG. 5 depicts a second modified aspect of the substrate treatment equipment according to the first embodiment.

Referring to FIG. 5, a chemical solution preparation unit 51 is added to the treatment solution supply pipe 27 of the aspect shown in FIG. 2.

The chemical solution preparation unit 51 has a mixing part 52 (manifold) serving as a pipe capable of mixing therein the chemical solution and the hydrogen-dissolved treatment solution from which the dissolved oxygen and the hydrogen peroxide have been removed using the unit including the catalytic unit 21 and the membrane separation unit 22.

The mixing part 52 is connected with a first chemical solution supply pipe 53 configured to supply the chemical solution. The first chemical solution supply pipe 53 is interposed with a chemical solution valve 54 and a chemical solution flow regulator valve 55.

The 'chemical solution' means a chemical solution before the mixing with the inert gas-dissolved water. As the chemical solution, hydrofluoric acid (HF), hydrochloric acid (HCl), IPA (isopropyl alcohol), a mixed solution of hydrofluoric acid and IPA (isopropyl alcohol), ammonium fluoride ($NH_4F$), and ammonia ($NH_3$) may be exemplified. When hydrofluoric acid is used as a chemical solution for etching, hydrofluoric acid and the hydrogen-dissolved treatment solution are mixed (combined) in a predetermined ratio and dilute hydrofluoric acid (DHF) is thus produced in the mixing part 52.

When the chemical solution valve 54 is opened, a predetermined flow rate of the chemical solution adjusted by the chemical solution flow regulator valve 55 can be supplied to the mixing part 52. When the chemical solution valve 54 is opened with the treatment solution valve 28 being opened, the chemical solution is injected to the hydrogen-dissolved treatment solution flowing in the mixing part 52, so that the chemical solution and the hydrogen-dissolved treatment solution can be mixed. Therefore, it is possible to prepare a predetermined relatively diluted chemical solution by adjusting the supply amount of the chemical solution and the supply amount of the hydrogen-dissolved treatment solution to the mixing part 52.

Also, it is possible to supply only the hydrogen-dissolved treatment solution to the mixing part 52 by opening only the treatment solution valve 28 without opening the chemical solution valve 54. Thereby, it is possible to supply the hydrogen-dissolved treatment solution, as it is, to the treatment solution nozzle 4, as the rinsing solution, without mixing the chemical solution with the hydrogen-dissolved treatment solution.

An end portion of the first chemical solution supply pipe 53 is inserted into a chemical solution tank 56 configured to store therein the chemical solution. The chemical solution tank 56 is a sealed container, and an internal space of the chemical solution tank 56 is shielded from an external space thereof. The first chemical solution supply pipe 53 is interposed with a pump 57 between the chemical solution valve 54 and the chemical solution tank 56. In addition, the first chemical solution supply pipe 53 is preferably interposed with a filter and a degasifying unit (not shown) at a downstream side of the pump 57. In the meantime, the first chemical solution supply pipe 53 is branched into a path facing towards the chemical solution valve 54 and the mixing part 52 and a path facing towards another treatment chamber at a downstream side of the pump 57.

Also, the chemical solution tank 56 is connected with a second chemical solution supply pipe 75. The chemical solution tank 56 is supplied with the chemical solution from a chemical solution supply source (not shown) via the chemical solution supply pipe 75. The second chemical solution supply pipe 75 is interposed with a chemical solution valve 76 for switching supply and supply stop of the chemical solution to the chemical solution tank 56. The chemical solution tank 56 is supplied with the unused chemical solution when a solution amount in the chemical solution tank 56 is a predetermined amount or less, for example. Thereby, it is possible to replenish the chemical solution tank 56 with the unused chemical solution.

In addition, the chemical solution tank 56 is connected with an inert gas supply pipe 77. The chemical solution tank 56 is supplied with the inert gas from an inert gas supply source (not shown) via the inert gas supply pipe 77. The inert gas supply pipe 77 is interposed with an inert gas valve 78 for switching supply and supply stop of the inert gas to the chemical solution tank 56. The chemical solution tank 56 is supplied with the inert gas all the time, for example. According to this modified aspect, the inert gas supply unit is configured by the inert gas supply pipe 77 and the inert gas valve 78.

Also, it is possible to flush out the air from the chemical solution tank 56 by supplying the inert gas to the chemical solution tank 56. Therefore, it is possible to suppress or prevent the oxygen included in the air within the chemical solution tank 56 from being dissolved in the chemical solution stored in the chemical solution tank 56 to increase the amount of dissolved oxygen in the chemical solution. Also, it is possible to pneumatically transport the chemical solution stored in the chemical solution tank 56 to the first chemical solution supply pipe 53 by pressing the inside of the chemical solution tank 56 with the inert gas.

The chemical solution in the chemical solution tank 56 is pumped out from the chemical solution tank 56 and sent to the first chemical solution supply pipe 53 by a pressure of the inert gas or a suction force of the pump 57. At this time, when the filter and the degasifying unit are provided just downstream of the pump 57, the chemical solution pumped by the pump 57 is passed through the filter, so that the foreign substances in the solution are removed. In addition, the chemical solution having passed through the filter is degasified by the degasifying unit, so that the amount of dissolved oxygen is reduced. As a result, it is possible to supply the chemical solution of which the amount of dissolved oxygen has been reduced to the mixing part 52, thereby further improving the effects of the disclosure. The filter and the degasifying unit may be provided in order of the degasifying unit and the filter at the downstream side of the pump 57. Also in this case, the same effects are accomplished.

In the meantime, the second modified aspect may also be applied to the first modified aspect of FIG. 4. In this case, the chemical solution preparation unit 51 is preferably configured at the pipe part between the catalytic unit 21 and the membrane separation unit 22 in the first modified aspect.

<Third Modified Aspect>

In the aspect of FIG. 5, the chemical solution and the hydrogen-dissolved treatment solution are mixed by injecting the chemical solution to the hydrogen-dissolved treatment solution flowing in the mixing part 52 that is a part of the treatment solution supply pipe 27. However, the disclosure can adopt an aspect of FIG. 6. That is, according to this aspect, the hydrogen-dissolved treatment solution flowing in the treatment solution supply pipe 27 and the chemical solution are introduced into a tank, so that the chemical solution is diluted with the hydrogen-dissolved treatment solution and is then supplied to the treatment solution nozzle 4. This aspect is efficient when the chemical solution incapable of passing through the catalytic unit 21 is used and it is difficult to realize a targeted dilution ratio in the aspect of FIG. 5 (the mixing part 52 in the pipe).

Figure 6:
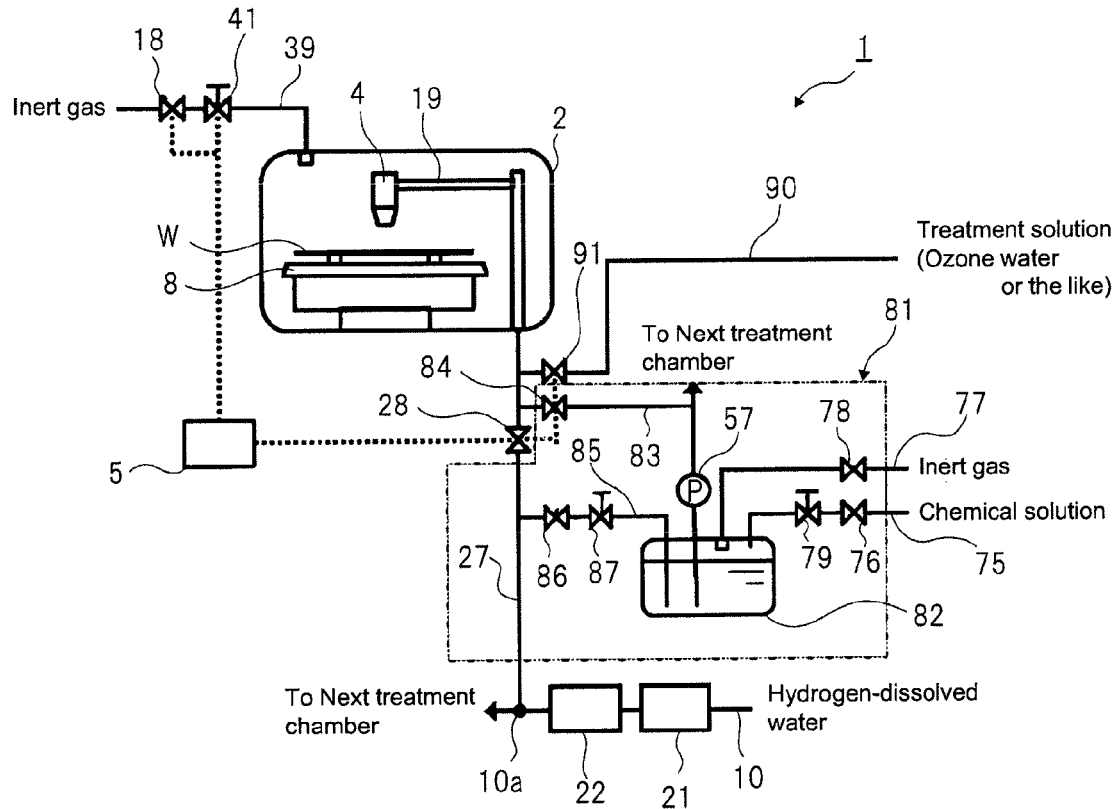
FIG. 6 depicts a third modified aspect of the substrate treatment equipment according to the first embodiment.

Referring to FIG. 6, a chemical solution preparation unit 81 is added to the treatment solution supply pipe 27 of the aspect shown in FIG. 2.

The chemical solution preparation unit 81 has a chemical solution dilution tank 82 configured to accommodate therein the chemical solution and the hydrogen-dissolved treatment solution from which the dissolved oxygen and the hydrogen peroxide have been removed using the unit including the catalytic unit 21 and the membrane separation unit 22 and to prepare a dilute chemical solution. The chemical solution dilution tank 82 is a sealed container, and an internal space of the chemical solution dilution tank 82 is shielded from an external space thereof.

In the chemical solution dilution tank 82, one end of a dilute chemical solution supply pipe 83 configured to supply the dilute chemical solution is inserted. The other end of the dilute chemical solution supply pipe 83 is connected to a part of the treatment solution supply pipe 27 lying downstream of the treatment solution valve 28. The dilute chemical solution supply pipe 83 is interposed with a dilute chemical solution valve 84 for switching supply and supply stop of the dilute chemical solution to the treatment solution supply pipe 27.

In addition, the dilute chemical solution supply pipe 83 is interposed with the pump 57 between the dilute chemical solution valve 84 and the chemical solution dilution tank 82. The filter and the degasifying unit (not shown) are preferably interposed at a part of the dilute chemical solution supply pipe 83 lying downstream of the pump 57. In a meantime, the dilute chemical solution supply pipe 83 is branched into a path facing towards the dilute chemical solution valve 84 and a path facing towards another treatment chamber at a downstream side of the pump 57.

In the chemical solution dilution tank 82, one end of a second treatment solution supply pipe 85 configured to supply the hydrogen-dissolved treatment solution is inserted. The other end of the second treatment solution supply pipe 85 is connected to a part of the treatment solution supply pipe 27 lying upstream of the treatment solution valve 28. The second treatment solution supply pipe 85 is interposed with a treatment solution valve 86 for switching supply and supply stop of the hydrogen-dissolved treatment solution to the chemical solution dilution tank 82 and a treatment solution flow regulator valve 87 configured to regulate the hydrogen-dissolved treatment solution, which is to be supplied to the chemical solution dilution tank 82, to a predetermined flow rate.

The chemical solution dilution tank 82 is connected with the chemical solution supply pipe 75. The chemical solution from the chemical solution supply source (not shown) is supplied into the chemical solution dilution tank 82 via the chemical solution supply pipe 75. The chemical solution supply pipe 75 is interposed with the chemical solution valve 76 for switching supply and supply stop of the chemical solution to the chemical solution dilution tank 82 and a chemical solution flow regulator valve 79 configured to regulate the chemical solution, which is to be supplied to the chemical solution dilution tank 82, to a predetermined flow rate.

In addition, the chemical solution dilution tank 82 is connected with the inert gas supply pipe 77. The chemical solution dilution tank 82 is supplied with the inert gas from the inert gas supply source (not shown) via the inert gas supply pipe 77. The inert gas supply pipe 77 is interposed with the inert gas valve 78 for switching supply and supply stop of the inert gas to the chemical solution dilution tank 82. The chemical solution dilution tank 82 is supplied with the inert gas all the time, for example. The inert gas supply unit is configured by the inert gas supply pipe 77 and the inert gas valve 78.

According to this aspect, it is possible to supply a predetermined flow rate of the hydrogen-dissolved treatment solution regulated by the treatment solution flow regulator valve 87 to the chemical solution dilution tank 82 by opening the separate treatment solution valve 86 without opening the treatment solution valve 28. Also, it is possible to supply a predetermined flow rate of the chemical solution regulated by the chemical solution flow regulator valve 79 to the chemical solution dilution tank 82 by opening the chemical solution valve 76 without opening the treatment solution valve 28. By these operations, it is possible to mix the chemical solution and the hydrogen-dissolved treatment solution in the chemical solution dilution tank 82. Therefore, it is possible to prepare the predetermined relatively diluted chemical solution in the chemical solution dilution tank 82 by adjusting the supply amount of the chemical solution and the supply amount of the hydrogen-dissolved treatment solution by using the treatment solution flow regulator valve 87 and the chemical solution flow regulator valve 79. Also, it is possible to supply the dilute chemical solution to the treatment solution nozzle 4 by opening only the dilute chemical solution valve 84 without opening the treatment solution valve 28.

On the other hand, it is possible to supply only the hydrogen-dissolved treatment solution to the treatment chamber 2 by opening only the treatment solution valve 28 without opening the dilute chemical solution valve 84. Thereby, it is possible to supply the hydrogen-dissolved treatment solution, as it is, to the treatment solution nozzle 4, as the rinsing solution, without mixing the chemical solution with the hydrogen-dissolved treatment solution.

Also, it is possible to flush out the air from the chemical solution dilution tank 82 by supplying the inert gas to the chemical solution dilution tank 82 through the inert gas supply pipe 77. Therefore, it is possible to suppress or prevent the oxygen included in the air within the chemical solution dilution tank 82 from being dissolved in the dilute chemical solution stored in the chemical solution dilution tank 82 to increase the amount of dissolved oxygen in the dilute chemical solution. Also, it is possible to pneumatically transport the dilute chemical solution in the chemical solution dilution tank 82 to the dilute chemical solution supply pipe 83 by pressing the inside of the chemical solution dilution tank 82 with the inert gas.

The dilute chemical solution in the chemical solution dilution tank 82 is pumped out from the chemical solution dilution tank 82 and sent to the dilute chemical solution supply pipe 83 by the pressure of the inert gas or the suction force of the pump 57. At this time, when the filter and the degasifying unit are provided just downstream of the pump 57, the dilute chemical solution pumped by the pump 57 is passed through the filter, so that the foreign substances in the solution are removed. In addition, the dilute chemical solution having passed through the filter is degasified by the degasifying unit, so that the amount of dissolved oxygen is reduced. As a result, it is possible to supply the dilute chemical solution of which the amount of dissolved oxygen has been reduced to the treatment solution supply pipe 27, thereby further improving the effects of the disclosure. The filter and the degasifying unit may be provided in order of the degasifying unit and the filter at the downstream side of the pump 57. Also in this case, the same effects are accomplished.

In the meantime, the third modified aspect may also be applied to the first modified aspect of FIG. 4. In this case, the chemical solution preparation unit 81 is preferably disposed at the pipe part between the catalytic unit 21 and the membrane separation unit 22 in the first modified aspect.

In addition, according to the third modified aspect, another treatment solution supply pipe 90 configured to supply a treatment solution (for example, treatment water for which the hydrogen addition is not necessarily required, such as ozone water) except for the hydrogen-dissolved treatment solution to the treatment solution nozzle 4 may be connected to a part of the treatment solution supply pipe 27 lying downstream of the treatment solution valve 28. The treatment solution supply pipe 90 is interposed with a treatment solution valve 91 for switching supply and supply stop of another treatment solution to the treatment solution nozzle 4. By switching the opening and closing operations of the treatment solution valve 28, the treatment solution valve 91 and the dilute chemical solution valve 84 by the control unit 5, it is possible to select the treatment solution.

<Fourth Modified Aspect>

Figure 7:
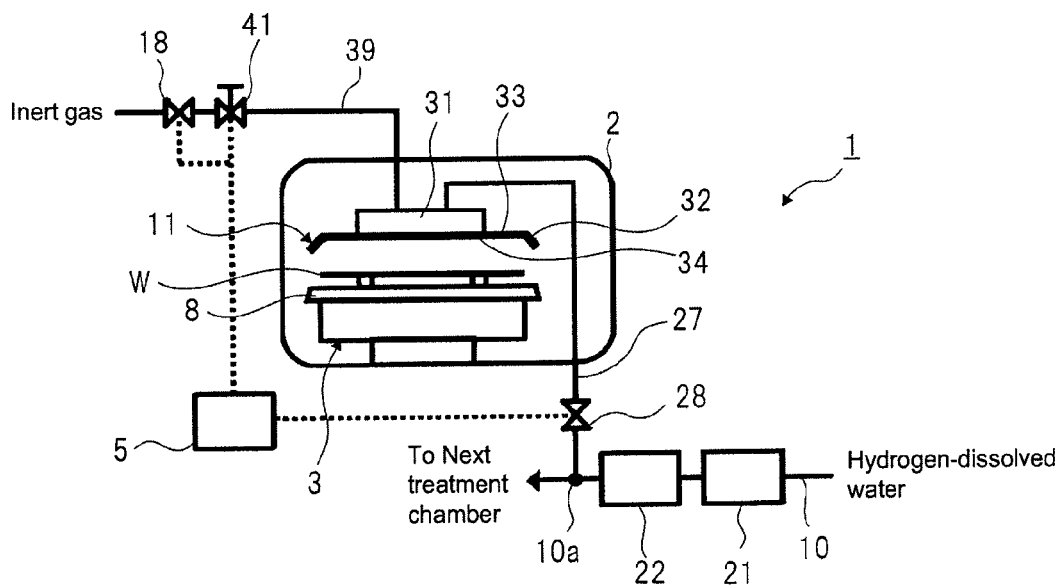
FIG. 7 depicts a fourth modified aspect of the substrate treatment equipment according to the first embodiment.

In the above aspects, the treatment solution nozzle 4 is held to the nozzle arm 19 and the support shaft 20. However, an aspect of FIG. 7 is also possible. In the aspect of FIG. 7, a shield plate 11 is provided in place of the treatment solution nozzle 4 held to the nozzle arm 19 and the support shaft 20.

Referring to FIG. 7, the shield plate 11 is a disc-shaped member of which thickness is substantially constant. A diameter of the shield plate 11 is greater than the substrate W. The shield plate 11 is horizontally disposed above the spin chuck 3 so that a central axis thereof is positioned on the common axis to the rotating axis of the spin chuck 3.

The shield plate 11 has a disc-shaped plain plate part 33. A lower surface of the plain plate part 33 is a plane surface and is parallel with the upper surface of the substrate W held at the spin chuck 3. The lower surface of the plain plate part 33 is a substrate facing surface 34 facing the substrate W held at the spin chuck 3. The substrate facing surface 34 faces the substrate W held at the spin chuck 3 and the upper surface of the spin base 8. In the meantime, as shown in FIG. 7, an outer periphery of the shield plate 11 is preferably bent downwards over an entire circumference to form a cylindrical peripheral wall part 32. That is, the peripheral wall part 32 protruding from the periphery of the substrate facing surface 34 towards the spin chuck 3 may be formed.

A central portion of the shield plate 11 is provided with a hollow support shaft 31 configured to support the shield plate 11, and the treatment solution supply pipe 27 is inserted in the support shaft 31. The shield plate 11 is formed with one or more discharge port (not shown) to communicate with an internal space of the support shaft 31. The treatment solution is supplied into the internal space of the support shaft 31 through the treatment solution supply pipe 27. Thereby, it is possible to discharge the treatment solution from the discharge port formed in the shield plate 11 towards the upper surface of the substrate W held at the spin chuck 3.

In addition, the gas supply pipe 39 is inserted in the support shaft 31. The nitrogen gas, which is an example of the inert gas, is supplied from the gas supply pipe 39 to the internal space of the support shaft 31. The inert gas supplied into the internal space of the support shaft 31 is discharged downwards from the discharge port (not shown) formed in the shield plate 11. For this reason, it is possible to supply the inert gas into a space (gap) between the shield plate 11 and the substrate W held at the spin chuck 3.

The gas supply pipe 39 is interposed with the gas valve 18 for switching supply and supply stop of the inert gas to the gap and the gas flow regulator valve 41 configured to regulate a supply flow rate of the inert gas to the gap.

Also, the support shaft 31 is coupled with a shield plate elevation driving mechanism (shield member moving mechanism) and a shield plate rotation driving mechanism. By a driving force of the shield plate elevation driving mechanism, it is possible to integrally elevate the support shaft 31 and the shield plate 11 between a treatment position at which the substrate facing surface 34 comes close to the upper surface of the spin base 8 and a retreat position at which the substrate facing surface 34 is largely separated from the upper surface of the spin base 8. In addition, by a driving force of the shield plate rotation driving mechanism, it is possible to integrally rotate the support shaft 31 and the shield plate 11 about the common axis to the substrate W. Thereby, it is possible to rotate the support shaft 31 and the shield plate 11 in substantial synchronization with the rotation of the substrate W by the spin chuck 3 (alternatively, at a slight different rotating speed).

According to the aspect of FIG. 7, the shield plate 11 is located at the treatment position with the substrate W being held at the spin chuck 3. Also, when the inert gas is discharged from the discharge port on the substrate facing surface 34, the inert gas spreads outwards in the space between the upper surface of the substrate W held at the spin chuck 3 and the substrate facing surface 34. Therefore, the air in the space between the upper surface of the substrate W and the substrate facing surface 34 is pushed outwards by the inert gas and is discharged from a gap formed between a tip edge of the peripheral wall part 32 and the upper surface of the spin base 8. Thereby, it is possible to replace the atmosphere between the upper surface of the substrate W and the substrate facing surface 34 with the inert gas.

In addition, when the shield plate 11 is located at the treatment position with the substrate W being held at the spin chuck 3, the space between the upper surface of the substrate W and the substrate facing surface 34 can be surrounded by the peripheral wall part 32, so that it is possible to suppress or prevent the surrounding air from being introduced to the outer periphery of the space. Thereby, it is possible to suppress or prevent the air from being introduced into the space between the upper surface of the substrate W and the substrate facing surface 34 to increase the concentration of oxygen in the space after the atmosphere between the upper surface of the substrate W and the substrate facing surface 34 is replaced with the inert gas.

<Fifth Modified Aspect>

Figure 8:
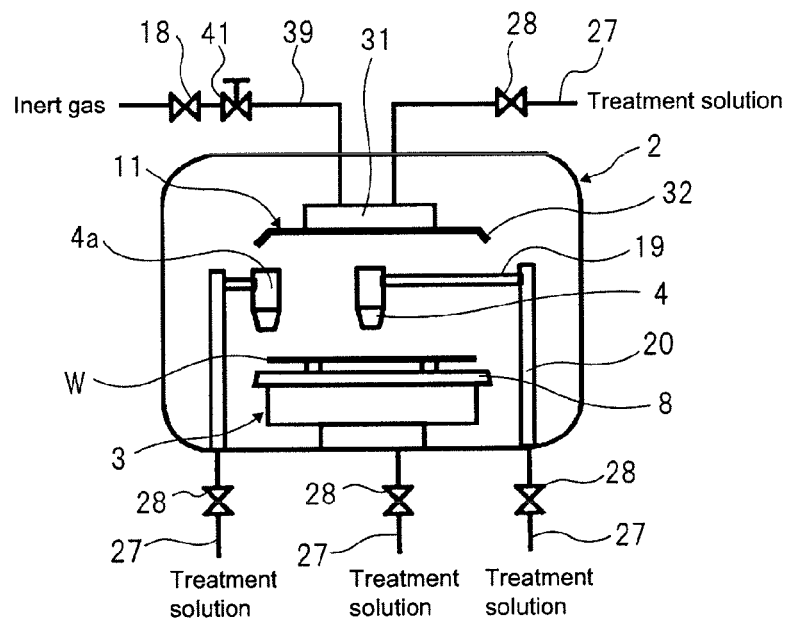
FIG. 8 depicts a fifth modified aspect of the substrate treatment equipment according to the first embodiment.

Each of the above aspects is the aspect (the nozzle aspect) where the treatment solution nozzle 4 is disposed above the spin chuck 3 having the substrate W held thereto or the aspect (the shield plate aspect) where the shield plate 11 having the treatment solution discharge port formed therein is disposed above the spin chuck 3. However, the disclosure may have both the nozzle aspect and the shield plate aspect, as shown in FIG. 8.

Also, the treatment solution nozzle may be provided by one or may be provided for each purpose of the cleaning and the etching or for each type of the treatment solution. For example, as shown in FIG. 8, a treatment solution nozzle 4a for cleaning a peripheral end portion of the substrate W may be provided in the treatment chamber 2. A treatment solution nozzle (not shown) for cleaning the shield plate 11, more particularly, the substrate facing surface 34 may also be provided. Alternatively, an aspect where the treatment solution supply pipe 27 is inserted into the spin chuck 3, which is the substrate holding mechanism, and the treatment solution is supplied to the lower surface of the substrate W may also be adopted.

Also, the treatment solution nozzle may be a two-fluid nozzle configured to mix the treatment solution supplied into the nozzle and the inert gas and to generate droplets of the treatment solution, for example.

<Sixth Modified Aspect>

Figure 9:
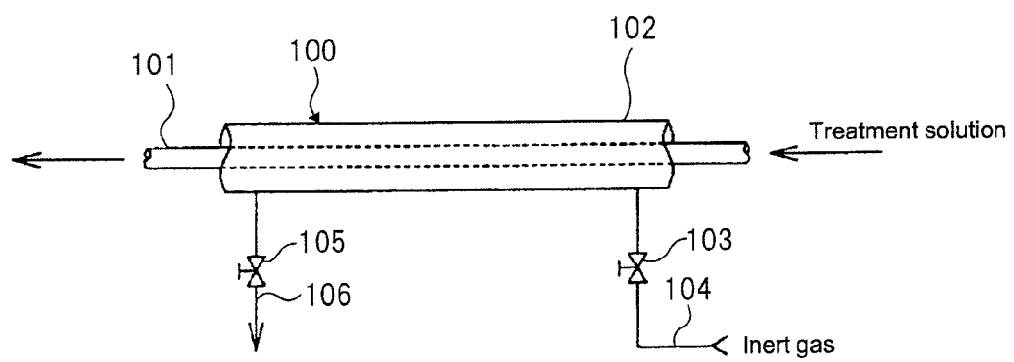
FIG. 9 depicts a preferred aspect of a pipe to be used for the substrate treatment equipment of the disclosure.

FIG. 9 depicts a preferred aspect of the pipe that is to be used for the substrate treatment equipment 1 of the disclosure.

Any one or all of the pipe from the catalytic unit 21 to the treatment solution nozzle 4 or the discharge port formed in the shield plate 11, the pipe from the catalytic unit 21 to the chemical solution dilution tank 82, and the pipe from the chemical solution dilution tank 82 to the treatment solution nozzle 4 or the discharge port formed in the shield plate 11 is preferably formed in an aspect of FIG. 9. Herein, all the pipes are collectively referred to as 'pipe 100.'

Referring to FIG. 9, the pipe 100 has a dual structure having an inner pipe 101 through which the treatment solution passes and an outer pipe 102 configured to surround the inner pipe 101. The inner pipe 101 is supported by a support member (not shown) interposed between the inner pipe 101 and the outer pipe 102 within the outer pipe 102. The inner pipe 101 is supported without contacting the outer pipe 102. A cylindrical space is formed between the inner pipe 101 and the outer pipe 102. The inner pipe 101 is made of a fluorine resin such as PFA, PTFE or the like having excellent chemical solution resistance and heat resistance, for example. The fluorine resin can permeate the oxygen therethrough. As the outer pipe, a pipe made of PVC, the fluorine resin or the like can be used, for example.

Also, the outer pipe 102 is connected with an inert gas supply pipe 104 having an inert gas valve 103 interposed therebetween and an exhaust pipe 106 having an exhaust valve 105 interposed therebetween. By opening the inert gas valve 103, it is possible to supply the inert gas from the inert gas supply source (for example, the nitrogen gas) into the outer pipe 102 through the inert gas supply pipe 104. Thereby, it is possible to fill the space between the inner pipe 101 and the outer pipe 102 with the inert gas. The inert gas filling unit is configured by the inert gas valve 103 and the inert gas supply pipe 104. Also, by opening the exhaust valve 105, it is possible to exhaust the gas from the space between the inner pipe 101 and the outer pipe 102.

When the inert gas valve 103 is opened with the exhaust valve 105 being opened, the air is flushed out from the space between the inner pipe 101 and the outer pipe 102, so that the atmosphere of the space can be replaced with the inert gas atmosphere. Thereby, it is possible to surround the inner pipe 101 by the inert gas. When the inert gas valve 103 and the exhaust valve 105 are closed after the atmosphere between the inner pipe 101 and the outer pipe 102 is replaced with the inert gas atmosphere, the state where the inner pipe 101 is surrounded by the inert gas can be maintained.

By surrounding the inner pipe 101 with the inert gas, it is possible to reduce the amount of oxygen to be introduced into the inner pipe 101 through a pipe wall of the inner pipe 101. Thereby, it is possible to suppress or prevent the oxygen from being dissolved in the treatment solution flowing through the inner pipe 101 to increase the concentration of oxygen in the treatment solution.

Second Embodiment

The treatment chamber 2 of the first embodiment has the single wafer cleaning mechanism. However, the treatment chamber that is to be used for the disclosure is not limited thereto, and may be a treatment chamber having a batch-type cleaning mechanism.

Figure 10:
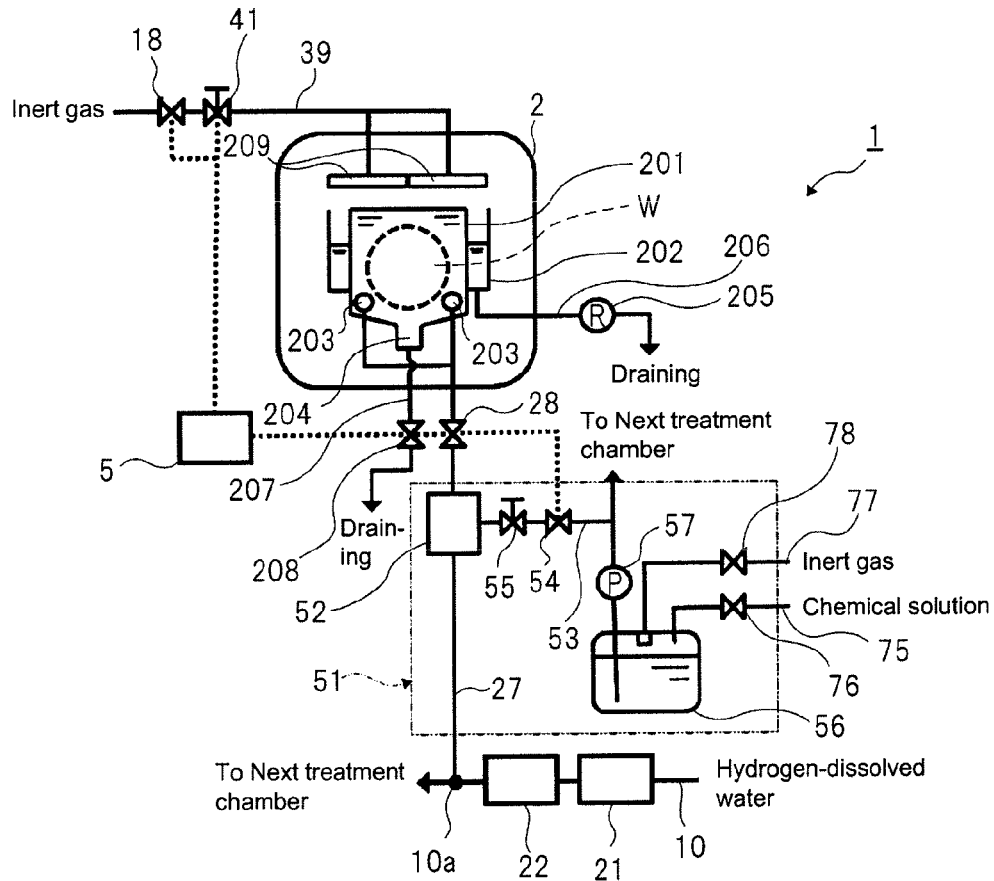
FIG. 10 depicts a schematic configuration of a substrate treatment equipment according to a second embodiment.

FIG. 10 depicts an example where the treatment chamber of the aspect of FIG. 5 (the second modified aspect) is changed with a treatment chamber having a batch-type cleaning mechanism. FIG. 10 simply depicts an example, and not only the second modified aspect but also the first to sixth modified aspects can be applied to the treatment chamber 2 having the batch-type cleaning mechanism. In the meantime, the same constitutional elements as the first embodiment are denoted with the same reference numerals and the descriptions thereof are omitted.

Referring to FIG. 10, the treatment chamber 2 of the substrate treatment equipment 1 according to the second embodiment has a treatment tank 201 configured to store therein the treatment solution and provided to clean the substrate W by the treatment solution. The treatment tank 201 is provided on its outer periphery with an overflow part 202 configured to accommodate therein the treatment solution overflowed from the treatment tank 201.

In the treatment chamber 2, a substrate conveying mechanism (not shown) for conveying the substrate W into the treatment tank 201 is provided. As the substrate conveying mechanism, a lifter and a chuck are used. The chuck is configured to convey a plurality of substrates W from an outside of the treatment chamber 2 to the upper of the treatment tank 201 with collectively holding the substrates W. The lifter is configured to receive the substrates W from the chuck above the treatment tank 201, to lower the substrates W with collectively holding the substrates W and to immerse the substrates W into the treatment solution stored in the treatment tank 201.

The treatment tank 201 is provided at a bottom with treatment solution nozzles 203 configured to supply the treatment solution into the treatment tank 201. The respective treatment solution nozzles 203 are connected with pipes branched from the treatment solution supply pipe 27. Each of the treatment solution nozzles 203 is formed with a plurality of ejection ports for ejecting the treatment solution towards the substrate W.

As described in the first embodiment, the treatment solution is the hydrogen-dissolved treatment solution from which the dissolved oxygen and the hydrogen peroxide have been removed using the unit including the catalytic unit 21 and the membrane separation unit 22.

The ejected treatment solution is stored in the treatment tank 201 and overflows from an upper end of the treatment tank 201. At this time, the substrates W are uniformly cleaned by the upward flow of the treatment solution.

The treatment solution provided for the cleaning treatment of the substrate W and overflowed from the upper end of the treatment tank 201 is temporarily stored in the overflow part 202 formed on the outer periphery of the treatment tank 201. A bottom of the overflow part 202 is connected with a drainpipe 206 having a specific resistance meter 205. For this reason, the pure water temporarily stored in the overflow part 202 is passed through the specific resistance meter 205 and is then discharged to the outside of the substrate treatment equipment 1.

The specific resistance meter 205 is configured to measure cleanliness of the treatment solution by measuring a specific resistance value of the treatment solution provided for cleaning the substrate W and to determine the cleanliness of the substrate W on the basis of the measured value.

In order to rapidly discharge the treatment solution stored in the treatment tank 201, the treatment tank 201 is formed at the bottom with an outlet 204 having a relatively large diameter. The outlet 204 is connected with a drainpipe 207 for discharging the treatment solution to the outside of the substrate treatment equipment 1. The drainpipe 207 is interposed with a drain valve 208 that is to be opened and closed by the control unit 5.

A pair of cover members 209 configured to open and close an opening of the treatment tank 201 is disposed at the upper of the treatment tank 201. Each cover member 209 is formed with a discharge port, and the discharge port is connected with a pipe branched from the gas supply pipe 39. Thereby, it is possible to supply the inert gas into the treatment tank 201 covered with the cover members 209, thereby purging a space above the treatment solution in the treatment tank 201 with the inert gas.

In this way, it is possible to reduce a vertical space configured by the treatment tank 201 and the cover members 209 by forming the discharge ports of the inert gas in the cover members 209 in place of the nozzle configured to supply the inert gas into the treatment tank 201, thereby preventing the substrate treatment equipment 1 from being enlarged as a whole. Also, it is possible to shorten a distance between a liquid surface of the treatment solution stored in the treatment tank 201 and lower surfaces of the cover members 209, so that it is possible to further reduce the amount of the inert gas to be supplied into the treatment tank 201.

Third Embodiment

Figure 11:
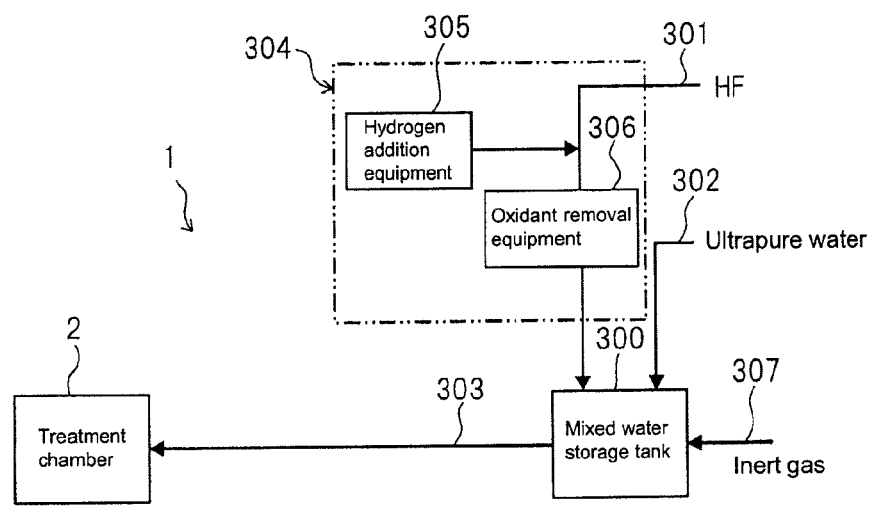
FIG. 11 depicts a schematic configuration of a substrate treatment equipment according to a third embodiment.

FIG. 11 depicts a schematic configuration of a substrate treatment equipment according to a third embodiment of the disclosure.

In this embodiment, dilute hydrofluoric acid is prepared by mixing hydrofluoric acid (HF) and ultrapure water for cleaning or etching a semiconductor wafer, and is then supplied to the treatment chamber 2 of the substrate treatment equipment 1. In the description, 'hydrofluoric acid' may also be abbreviated as 'HF.' Also, in the disclosure, buffered hydrofluoric acid (BHF), which is to be mainly used for cleaning or etching an insulating film, may also be used in place of hydrofluoric acid (HF) of the treatment solution stock solution. The buffered hydrofluoric acid is a mixed solution of hydrofluoric acid (HF) and ammonium fluoride.

In this embodiment, the substrate treatment equipment 1 has a mixed water storage tank 300 configured to prepare and store therein dilute hydrofluoric acid (DHF) by mixing HF and ultrapure water, an HF supply line 301 (hydrofluoric acid supply unit) configured to supply HF in a chemical solution tank (not shown) to the mixed water storage tank 300, an ultrapure water supply line 302 (ultrapure water supply unit) configured to supply ultrapure water to the mixed water storage tank 300, and a treatment solution supply line 303 configured to send DHF as the substrate treatment solution to the treatment chamber 2.

On the HF supply line 301, an HF purification unit 304 configured to perform a purification method of a hydrofluoric acid solution according to the disclosure is provided. The HF purification unit 304 has a hydrogen addition equipment 305 configured to add hydrogen to HF and an oxidant removal equipment 306 configured to remove the dissolved oxygen and hydrogen peroxide in the HF having hydrogen added thereto.

It is possible to reduce the concentration of dissolved oxygen and the concentration of hydrogen peroxide in the HF by passing the HF stock solution having hydrogen added thereto by the hydrogen addition equipment 305 through the oxidant removal equipment 306. The concentration of hydrogen to be added is preferably 8 µg/L or higher (preferably, 15 µg/L or higher, more preferably 66 µg/L or higher).

The oxidant removal equipment 306 has an aspect where the platinum-group metal catalyst is filled therein. For example, a catalytic unit having a palladium catalyst filled therein or a catalytic unit having a palladium catalyst supported on a monolith may be cited. The specific examples of the platinum-group metal catalyst will be described in detail later (refer to a fifth embodiment).

As the HF stock solution is sequentially passed through the hydrogen addition equipment 305 and the oxidant removal equipment 306, the HF is purified to a liquid of which the concentration of dissolved oxygen is 2 µg/L or less and the concentration of hydrogen peroxide is 2 µg/L or less. This is based on evaluation results in embodiments to be described later.

The mixed water storage tank 300 is disposed at the rear of the oxidant removal equipment 306 and the ultrapure water supply line 302, and is configured to prepare and store DHF by mixing the HF purified in the HF purification unit 304 and the ultrapure water supplied from the ultrapure water supply line 302 in a tank. It is possible to prepare the DHF diluted to a predetermined concentration by adjusting a supply amount of the purified HF and a supply amount of the ultrapure water to the mixed water storage tank 300.

The ultrapure water supply line 302 is a pipe configured to supply the ultrapure water to the mixed water storage tank 300 from the subsystem (refer to FIG. 1) of the ultrapure water production equipment as described in Background Art, for example. As the ultrapure water that is to be supplied from the ultrapure water supply line 302, it is necessary to use the ultrapure water of which the concentration of dissolved oxygen and the concentration of hydrogen peroxide have been reduced to 2 µg/L or less in advance, respectively.

The mixed water storage tank 300 is a sealed container, and has an inert gas supply line 307 configured to supply the inert gas such as nitrogen gas or the like into the mixed water storage tank 300. It is possible to flush out the air from the mixed water storage tank 300 by supplying the inert gas to the mixed water storage tank 300. Therefore, it is possible to suppress or prevent the oxygen included in the air within the mixed water storage tank 300 from being dissolved in the DHF stored in the mixed water storage tank 300 to increase the amount of dissolved oxygen in the DHF. Also, it is possible to pneumatically transport the DHF stored in the mixed water storage tank 300 to the treatment solution supply line 303 by pressing the inside of the mixed water storage tank 300 with the inert gas.

In the meantime, a line configured to directly supply the HF stock solution purified in the HF purification unit 304 to the treatment chamber 2 without via the mixed water storage tank 300.

Also, the treatment chamber 2 may have any one of a single wafer treatment mechanism configured to hold a substrate to be treated and to discharge DHF to the substrate to be treated from a nozzle and a batch-type treatment mechanism configured to accommodate a substrate to be treated in a treatment tank, to supply DHF into the treatment tank and to immerse the substrate to be treated in the DHF. In addition, from standpoints of corrosion and oxidation suppression of the metal on the surface of the body to be treated, it is preferably to fill the treatment chamber 2 with the inert gas during the substrate treatment and to thus reduce the concentration of oxygen gas in the treatment chamber 2 to 2% or less.

Fourth Embodiment

Figure 12:
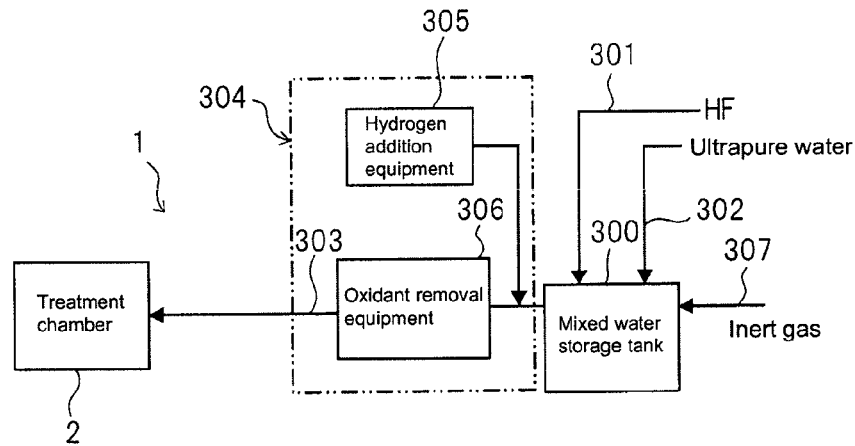
FIG. 12 depicts a schematic configuration of a substrate treatment equipment according to a fourth embodiment.

FIG. 12 depicts a schematic configuration of a substrate treatment equipment according to a fourth embodiment of the disclosure. In FIG. 12, the same constitutional elements as the third embodiment are denoted as the same reference numerals, and the descriptions thereof are omitted.

In the substrate treatment equipment 1 of this embodiment, the HF purification unit 304 is provided on the treatment solution supply line 303. That is, in the third embodiment, the dissolved oxygen and the dissolved hydrogen peroxide are removed from the HF stock solution. However, in the fourth embodiment, the dissolved oxygen and the dissolved hydrogen peroxide are removed from DHF (dilute hydrofluoric acid) obtained by diluting the HF stock solution with the ultrapure water.

Referring to FIG. 12, the mixed water storage tank 300 is directly connected with the HF supply line 301 configured to supply the HF stock solution and the ultrapure water supply line 302 configured to supply the ultrapure water to the mixed water storage tank 300, respectively. It is possible to prepare DHF diluted to a predetermined concentration by adjusting a supply amount of the HF stock solution and a supply amount of the ultrapure water to the mixed water storage tank 300.

The oxidant removal equipment 306 is provided on the treatment solution supply line 303 configured to supply the DHF prepared in the mixed water storage tank 300 to the treatment chamber 2. In addition, the hydrogen addition equipment 305 is connected to a treatment solution supply line between the mixed water storage tank 300 and the oxidant removal equipment 306.

The hydrogen is added to DHF by the hydrogen addition equipment 305, so that the hydrogen reacts with the dissolved oxygen in the DHF to produce water. Therefore, it is possible to reduce the concentration of dissolved oxygen in the DHF. The concentration of hydrogen to be added is preferably 10 µg/L or higher, in terms of the removal of the dissolved oxygen.

In addition, the DHF of which the dissolved oxygen has been reduced is sequentially passed through the oxidant removal equipment 306, so that the DHF is purified to a liquid of which the concentration of dissolved oxygen is 2 µg/L or less and the concentration of hydrogen peroxide is 2 µg/L or less. This is based on evaluation results in a fifth embodiment to be described later.

In this embodiment, as the ultrapure water that is to be supplied from the ultrapure water supply line 302, ultrapure water of which the concentration of dissolved oxygen and the concentration of hydrogen peroxide have not been reduced to 2 µg/L or less may also be used.

Like the third embodiment, as the oxidant removal equipment 306, a catalytic unit having a palladium catalyst filled therein or a catalytic unit having a palladium catalyst supported on a monolith may be exemplified.

The fourth embodiment accomplishes the same effects as the third embodiment. In addition, according to the fourth embodiment, since the HF purification unit 304 is disposed closer to the treatment chamber 2 than the third embodiment, it is possible to supply the cleaner DHF to the treatment chamber 2.

Fifth Embodiment

The specific examples of a catalyst for removing the dissolved oxygen and the hydrogen peroxide, which is used for the above-mentioned catalytic unit 21 or the oxidant removal equipment 306, will be described in detail.

<Catalyst for Removing Dissolved Oxygen and Hydrogen Peroxide>

The platinum-group metal catalysts include a granular ion-exchange resin supporting a platinum-group metal, a metal ion-type granular cation exchange resin, and a non-granular organic porous body supporting a platinum-group metal or a non-granular organic porous ion exchanger supporting a platinum-group metal.

<Non-Granular Organic Porous Body Supporting Platinum-Group Metal, Non-Granular Organic Porous Ion Exchanger Supporting Platinum-Group Metal>

The non-granular organic porous body supporting the platinum-group metal includes a non-granular organic porous body supporting a platinum-group metal in which platinum-group metal fine particles having an average particle size of 1 to 1000 nm are supported on the non-granular organic porous body including a continuous skeleton phase and a continuous hole phase. In the non-granular organic porous body, a thickness of continuous skeletons is 1 to 100 µm, an average diameter of continuous holes is 1 to 1000 µm, a total pore volume is 0.5 to 50 ml/g, and an amount of supported platinum-group metal is 0.004 to 20% by weight in a dry condition.

The non-granular organic porous ion exchanger supporting the platinum-group metal includes a non-granular organic porous ion exchanger supporting a platinum-group metal in which platinum-group metal fine particles having an average particle size of 1 to 1000 nm are supported on the non-granular organic porous ion exchanger including a continuous skeleton phase and a continuous hole phase. In the non-granular organic porous ion exchanger, a thickness of continuous skeletons is 1 to 100 µm, an average diameter of continuous holes is 1 to 1000 µm, a total pore volume is 0.5 to 50 ml/g, an ion exchange capacity per weight is 1 to 6 mg equivalent weight/g in a dry condition, ion exchange groups are uniformly distributed, and an amount of supported platinum-group metal is 0.004 to 20% by weight in the dry condition.

The average diameter of the openings of the non-granular organic porous body or the non-granular organic porous ion exchanger is measured by a mercury intrusion method, and indicates a maximum value of a pore distribution curve obtained by the mercury intrusion method. In addition, the structure of the non-granular organic porous body or the non-granular organic porous ion exchanger, and the thickness of the continuous skeletons are determined by SEM observation. The particle sizes of the nano particles of the platinum-group metal supported on the non-granular organic porous body or the non-granular organic porous ion exchanger are determined by TEM observation.

Since the platinum-group metal having the average particle size of 1 to 100 nm is supported on the non-granular organic porous body or the non-granular organic porous ion exchanger, the non-granular organic porous body supporting the platinum-group metal or the non-granular organic porous ion exchanger supporting the platinum-group metal exhibits high catalytic activity for hydrogen peroxide decomposition, and allows water to be treated to pass therethrough at a space velocity (SV) of 200 to 20000 $h^{-1}$, preferably 2000 to 20000 $h^{-1}$.

In the non-granular organic porous body supporting the platinum-group metal, a carrier supporting the platinum-group metal is the non-granular organic porous body. This non-granular organic porous exchanger is a monolithic organic porous exchanger. In the non-granular organic porous ion exchanger supporting the platinum-group metal, a carrier supporting the platinum-group metal is the non-granular organic porous ion exchanger. This non-granular organic porous ion exchanger is a monolithic organic porous ion exchanger in which an ion exchange group is introduced into a monolithic organic porous body.

The monolithic organic porous body has its skeletons made of organic polymer, and includes many communication holes serving as the flow paths of a reaction solution among the skeletons. The monolithic organic porous ion exchanger is a porous body in which ion exchange groups are introduced to be uniformly distributed in the skeletons of the monolithic organic porous body. Herein, the "monolithic organic porous body" and the "monolithic organic porous ion exchanger" are also simply referred to as "monolith" and "monolithic ion exchanger" respectively, and a "monolithic organic porous intermediate body" that is an intermediate body (precursor) in monolith manufacturing is also simply referred to as "monolithic intermediate body."

Structural examples of such a monolith or a monolithic ion exchanger include a continuous bubble structure disclosed in JP 2002-306976A or JP 2009-62512A, a bicontinuous structure disclosed in JP 2009-67982A, a particle aggregation structure disclosed in JP 2009-7550A, and a particle composite structure disclosed in JP 2009-108294A.

Configuration examples of the above-mentioned monolith, i.e. the monolith serving as a carrier of the platinum-group metal particles, (hereinafter, also referred to as monolith (1)), and the monolithic ion exchanger, i.e. the monolithic ion exchanger serving as a carrier of the platinum-group metal particles (hereinafter, also referred to as monolithic ion exchanger (1)) include the monolith and the monolithic ion exchanger having the bicontinuous structures disclosed in JP 2009-67982A.

Specifically, the monolith (1) is a monolith before any ion exchange group is introduced, wherein the monolith is an organic porous body formed into a bicontinuous structure that includes three-dimensionally continuous skeletons made of aromatic vinyl polymers containing 0.1 to 5.0 mol % of a cross-linked structure unit in all building blocks and having an average thickness of 1 to 100 µm in the dry condition, and that also includes three-dimensionally continuous holes having an average diameter of 1 to 1000 µm among the skeletons, and wherein the organic porous body has a total pore volume set to 0.5 to 50 ml/g in the dry condition.

The monolithic ion exchanger (1) is a monolithic ion exchanger formed into a bicontinuous structure that includes three-dimensionally continuous skeletons made of aromatic vinyl polymers containing 0.1 to 5.0 mol % of a cross-linked structure unit in all building blocks and having an average thickness of 1 to 100 µm in the dry condition, and that also includes three-dimensionally continuous holes having an average diameter of 1 to 1000 µm among the skeletons, wherein the monolithic ion exchanger has a total pore volume set to 0.5 to 50 ml/g in the dry condition, has ion exchange groups that are uniformly distributed in the organic porous ion exchanger, and has an ion exchange capacity per weight set to 1 to 6 mg equivalent weight/g in the dry condition.

The monolith (1) or the monolithic ion exchanger (1) is formed into the bicontinuous structure that includes the three-dimensionally continuous skeletons having the average thickness of 1 to 100 µm, preferably 3 to 58 µm, in the dry condition, and that also includes the three-dimensionally continuous holes having the average diameter of 1 to 1000 µm, preferably 15 to 180 µm, particularly preferably 20 to 150 µm, in the dry condition among the skeletons. The bicontinuous structure is a structure in which the continuous skeleton phase and the continuous hole phase are three-dimensionally continuous. The continuous holes have high continuity and are not so different in size, as compared to the conventional continuous bubble-type monolith or the conventional particle aggregation-type monolith. Since the skeletons are thick, mechanical strength is high.

It is not desirable when the average diameter of the three-dimensionally continuous holes is less than 1 μm in the dry condition, because pressure loss increases during passage of the solution therethrough. It is not desirable when the average diameter of the three-dimensionally continuous holes is greater than 1000 μm in the dry condition, because the contact between the reaction solution and the monolith or the monolithic ion exchanger is not sufficient, so that the catalytic activity is not sufficient. Also, it is not desirable when the average thickness of the skeletons is less than 1 μm in the dry condition, because the monolith or the monolithic ion exchanger is highly deformed upon passage of the solution therethrough at a high flow velocity. In addition, such an average thickness is not desirable because the contact efficiency of the monolith or the monolithic ion exchanger with the reaction solution is reduced to lower the catalytic activity. On the other hand, it is not desirable when the average thickness of the skeletons is greater than 100 μm, because the skeletons excessively thicken, so that the pressure loss increases upon the passage of the solution therethrough.

The average diameter of the openings of the monolith (1), the average diameter of the openings of the monolithic ion exchanger (1), and the average diameter of the openings of the monolithic intermediate body (1) of the dry condition obtained by a I process in monolith manufacturing described below are measured by the mercury intrusion method, and indicate the maximum values of pore distribution curves obtained by the mercury intrusion method. In addition, the average thickness of the skeletons of the monolith (1) or the monolithic ion exchanger (1) in the dry condition is determined by the SEM observation of the monolith (1) or the monolithic ion exchanger (1) in the dry condition. Specifically, the SEM observation is carried out at least three times for the monolith (1) or the monolithic ion exchanger (1) in the dry condition, the thicknesses of skeletons in obtained images are measured, and the average value thereof is set as the average thickness. The skeleton is bar-shaped, and has a circular section. However, some skeletons may have different-diameter sections such as elliptic sections. In this case, a thickness is an average of short and long diameters.

The total pore volume per weight of the monolith (1) or the monolithic ion exchanger (1) in the dry condition is 0.5 to 50 ml/g. It is not desirable when the total pore volume is less than 0.5 ml/g, because pressure loss increases during passage of the solution therethrough. Further, such a total pore volume is not desirable because the transmission amount per unit sectional area is reduced to lower the treatment amount. It is not desirable when the total pore volume exceeds 50 ml/g, because mechanical strength is reduced to greatly deform the monolith or the monolithic ion exchanger during passage of the solution therethrough at a high flow velocity. Further, such a total pore volume is not desirable because the contact efficiency of the monolith (1) or the monolithic ion exchanger (1) with the reaction solution is reduced to lower catalytic activity. When the sizes of the three-dimensionally continuous holes and the total pore volume are within the above-mentioned ranges, the contact with the reaction solution is extremely uniform, the contact area is large, and passage of the solution can be carried out with low pressure loss.

In the monolith (1) or the monolithic ion exchanger (1), the material of the skeleton is an aromatic vinyl polymer containing 0.1 to 5 mol %, preferably 0.5 to 3.0 mol % of a cross-linked structure unit in all building blocks, and hydrophobic. It is not desirable when the cross-linked structure unit is less than 0.1 mol %, because mechanical strength is not sufficient. When the cross-linked structure unit exceeds 5 mol %, the structure of the porous body easily deviates from the bicontinuous structure. Types of aromatic vinyl polymers include, but not limited to, polystyrene, poly (α-methyl styrene), polyvinyl toluene, polyvinyl benzyl chloride, polyvinyl biphenyl, polyvinyl naphthalene, and the like. The above-mentioned polymer may be a polymer obtained by copolymerizing a single vinyl monomer with a cross-linking agent, a polymer obtained by polymerizing a plurality of vinyl monomers with a cross-linking agent, or a polymer obtained by blending two types or more of polymers. Among these organic polymer materials, a styrene-divinyl benzene copolymer or a vinyl benzyl chloride-divinyl benzene copolymer is preferable in View of easy formation of the bicontinuous structure, easy introduction of the ion exchange groups and the high mechanical strength and stability with respect to acid or alkali.

In the monolithic ion exchanger (1), the introduced ion exchange groups are uniformly distributed not only on the surface of the monolith but also in the skeletons of the monolith. The description "ion exchange groups are uniformly distributed" means that the ion exchange groups are uniformly distributed on the surface and in the skeletons by at least a m order. The distribution state of the ion exchange groups can be easily confirmed by using EPMA. In addition, when the ion exchange groups are uniformly distributed not only on the surface of the monolith but also in the skeletons of the monolith, physical properties and chemical properties on the surface and in the inside can be made uniform, improving resistance to swelling and shrinkage.

The ion exchange groups introduced into the monolithic ion exchanger (1) are cation exchange groups or anion exchange groups. The cation exchange groups include a carboxylic acid group, an iminodiacetic acid group, a sulfonic acid group, a phosphoric acid group, a phosphoester group, and the like. The anion exchange groups include a quaternary ammonium group such as a tri-methyl ammonium group, a tri-ethyl ammonium group, a tri-butyl ammonium group, a dimethyl hydroxy ethyl ammonium group, a dimethyl hydroxy propyl ammonium group, or a methyl dihydroxy ethyl ammonium group, a tertiary sulfonium group, a phosphonium group, and the like.

The monolithic ion exchanger (1) has an ion exchange capacity per weight in the dry condition set to 1 to 6 mg equivalent weight/g. In the monolithic ion exchanger (1), the continuity and uniformity of the three-dimensionally continuous holes are high, so that pressure loss does not increase much even when the total pore volume is reduced. Accordingly, the ion exchange capacity per volume can be increased dramatically while pressure loss is maintained low. By setting the ion exchange capacity per weight within the above-mentioned range, the environment around a catalytic active site, such as pH in the catalyst, can be changed, which causes catalytic activity to increase. When the monolithic ion exchanger (1) is a monolithic anion exchanger, anion exchange groups are introduced into the monolithic anion exchanger (1), and the anion exchange capacity per weight in the dry condition is 1 to 6 mg equivalent weight/g. When the monolithic ion exchanger (1) is a monolithic cation exchanger, cation exchange groups are introduced into the monolithic cation exchanger (1), and the cation exchange capacity per weight in the dry condition is 1 to 6 mg equivalent weight/g.

The monolith (1) is obtained by implementing the manufacturing method of the monolithic organic porous body disclosed in JP 2009-67982A. Specifically, the method includes:

a I process for stirring a mixture of an oil-soluble monomer that does not contain an ion exchange group, a surface active agent, and water to prepare water-in-oil emulsion, and then polymerizing the water-in-oil emulsion to obtain a monolithic organic porous intermediate body (hereinafter, also referred to as monolithic intermediate body (1)) of a continuous macropore structure in which the total pore volume is greater than 16 ml/g and is equal to or less than 30 ml/g;

a II process for preparing a mixture including an aromatic vinyl monomer, 0.3 to 5 mol % of a cross-linking agent among all oil-soluble monomers having at least two or more vinyl groups in one molecule, an organic solvent in which the aromatic vinyl monomer and the cross-linking agent are dissolved while a polymer prepared by polymerizing the aromatic vinyl monomer is not dissolved, and a polymerization initiator; and a III process for obtaining a monolith (1) that is the organic porous body of a bicontinuous structure by conducting polymerization under a stationary state of the mixture obtained in the II process and in the presence of the monolithic intermediate body (1) obtained in the I process.

The platinum-group metal is supported on the non-granular organic porous body supporting the platinum-group metal or the non-granular organic porous ion exchanger supporting the platinum-group metal. Such platinum-group metals are ruthenium, rhodium, palladium, osmium, iridium, and platinum. These platinum-group metals can be used singly, or two or more types of metals can be used in combination. Further, two or more types of metals can be used as an alloy. Among these metals, platinum, palladium, and the platinum-palladium alloy are preferable because of high catalytic activity.

The average particle size of the platinum-group metal fine particles supported on the non-granular organic porous body supporting the platinum-group metal or the non-granular organic porous ion exchanger supporting the platinum-group metal is 1 to 1000 nm, preferably 1 to 200 nm, and more preferably 1 to 20 nm. It is not desirable when the average particle size is less than 1 nm, because the possibility of the separation of the platinum-group metal fine particles from the carrier is higher. On the other hand, it is not desirable when the average particle size exceeds 1000 nm, because the surface area of the metal per unit mass is reduced which makes it difficult to achieve the catalyst effect efficiently. The average particle size of the platinum-group metal fine particles is determined by analyzing a TEM image obtained through transmission electron microscope (TEM) analysis.

The amount of supported platinum-group metal fine particles in the non-granular organic porous body supporting the platinum-group metal or the non-granular organic porous ion exchanger supporting the platinum-group metal ((platinum-group metal fine particles/the supported platinum-group metal catalyst of dry condition)×100) is 0.004 to 20% by weight, and preferably 0.005 to 15% by weight. It is not desirable when the amount of supported platinum-group metal fine particles is less than 0.004% by weight, because catalytic activity is insufficient. On the other hand, it is not desirable when the amount of supported platinum-group metal fine particles exceeds 20% by weight, because metal elution into the water is manifested.

The manufacturing method of the non-granular organic porous body supporting the platinum-group metal or the non-granular organic porous ion exchanger supporting the platinum-group metal is not limited to any particular method. By a known method, the supported platinum-group metal catalyst can be obtained by supporting the fine particles of the platinum-group metal on the monolith or the monolithic ion exchanger. An example of the method for supporting the platinum-group metal on the non-granular organic porous body or the non-granular organic porous ion exchanger includes a method disclosed in JP 2010-240641A. This is a method for, for example, immersing the monolithic ion exchanger of the dry condition in a methanol solution of a platinum-group metal compound such as palladium acetate, adsorbing palladium ions on the monolithic ion exchanger by ion exchanging, and then bringing the palladium ions into contact with a reducing agent to support palladium metal fine particles on the monolithic ion exchanger. Alternatively, this is a method for immersing the monolithic ion exchanger in an aqueous solution of a platinum-group metal compound such as tetra ammine palladium complex, adsorbing palladium ions on the monolithic ion exchanger by ion exchanging, and then bringing the palladium ions into contact with a reducing agent to support palladium metal fine particles on the monolithic ion exchanger.

A granular ion-exchange resin supporting a platinum-group metal is obtained by supporting a platinum-group metal on a granular ion-exchange resin. Examples of the granular ion-exchange resin serving as a carrier of the platinum-group metal include, but not limited to, a strongly basic anion exchange resin and the like. The platinum-group metal is supported on the granular ion-exchange resin by a known method to obtain the granular ion-exchange resin supporting the platinum-group metal.

A metal ion-type granular cation exchange resin supporting a metal is obtained by supporting a metal such as iron ions, copper ions, nickel ions, chrome ions, or cobalt ions on a granular cation exchange resin. Examples of the granular cation exchange resin serving as a carrier include, but not limited to, a strongly acidic cation exchange resin and the like. The metal such as iron ions, copper ions, nickel ions, chrome ions, or cobalt ions is supported on the granular cation exchange resin by a known method to obtain the metal ion-type granular cation exchange resin supporting the metal.

Hereinafter, the catalyst of the catalytic unit 21 used in the disclosure will be described in detail. However, this is only an example, and limitative of the disclosure.

<Manufacturing of Non-Granular Organic Porous Ion Exchanger Supporting Platinum-Group Metal>

(Manufacturing of Monolithic Intermediate Body (I Process))

9.28 g of styrene, 0.19 g of divinyl benzene, 0.50 g of sorbitan monooleate (hereinafter, abbreviated to SMO), and 0.25 g of 2,2'-azobis(isobutyronitrile) were mixed to be uniformly dissolved. Then, the mixture of the styrene/divinyl benzene/SMO/2,2'-azobis(isobutyronitrile) was added to 180 g of pure water, and stirred under reduced pressure by using a vacuum stirring and defoaming mixer (from EME Inc.) that was a planetary stirring equipment to obtain water-in-oil emulsion. This emulsion was quickly moved into a reaction container, and sealed and polymerized in a stationary state at 60° C. for 24 hours. After the end of polymerization, the contents were taken out, extracted by methanol, and then dried under reduced pressure to manufacture a monolithic intermediate body having a continuous macropore structure. An internal structure of the monolithic intermediate body (dried body) thus obtained was observed by SEM. According to the SEM image, although a wall part defining two adjacent macropores was extremely thin and bar-shaped, it had a continuous bubble structure, the average diameter of the openings (mesopores) at the overlapped part of the macropores measured by the mercury intrusion method was 40 μm, and the total pore volume was 18.2 ml/g.

(Manufacturing of Monolith)

Then, 216.6 g of styrene, 4.4 g of divinyl benzene, 220 g of 1-decanol, and 0.8 g of 2,2'-azobis(2,4-dimetyl valeronitrile) were mixed to be uniformly dissolved (II process). Then, the above-mentioned monolithic intermediate body was placed into the reaction container, and immersed in the mixture of the styrene/divinyl benzene/1-decanol/2,2'-azobis(2,4-dimetyl valeronitrile), and defoamed in a pressure-reduced chamber, and then the reaction container was sealed to polymerize the mixture in a stationary state at 50° C. for 24 hours. After the end of polymerization, the contents were taken out, soxhlet-extracted by acetone, and then dried under reduced pressure (Ill process).

An internal structure of the monolith (dried body) thus obtained and containing 1.2 mol % of a cross-linking component including a styrene/divinyl benzene copolymer was observed by SEM. According to the SEM observation, the monolith had a bicontinuous structure in which skeletons and holes were respectively three-dimensionally continuous and both phases were combined. The average thickness of the skeletons measured from the SEM image was 20 μm. In addition, the average diameter of the three-dimensionally continuous holes of the monolith measured by the mercury intrusion method was 70 μm, and the total pore volume was 4.4 ml/g. The average diameter of the holes was determined as a maximum value of a pore distribution curve obtained by the mercury intrusion method.

(Manufacturing of Monolithic Anion Exchanger)

The monolith manufactured by the above-mentioned method was placed in a column reaction container, a solution containing 1600 g of chlorosulfonic acid, 400 g of tin tetrachloride, and 2500 ml of dimethoxymethane was circulated and passed therethrough, and reaction was carried out at 30° C. for 5 hours to introduce a chloromethyl group. After the end of the reaction, the chloromethylated monolith was cleaned with the mixed solvent of THF/water (=2/1), and further cleaned with THF. 1600 ml of THF and 1400 ml of a trimethyl amine 30% aqueous slut ion were added to this chloromethylated monolith, and reaction was carried out at 60° C. for 6 hours. After the end of the reaction, the product was cleaned with methanol, and then cleaned with pure water to obtain a monolithic anion exchanger.

The anion exchange capacity of the obtained monolithic anion exchanger was 4.2 mg equivalent weight/g in the dry condition, and it was confirmed that a quaternary ammonium group was quantitatively introduced. The thickness of the skeletons measured from a SEM image was 20 m in the dry condition, and the average diameter of the three-dimensionally continuous holes of the monolithic anion exchanger measured by the mercury intrusion method was 70 μm in the dry condition, and the total pore volume was 4.4 ml/g in the dry condition.

Then, in order to check the distribution state of the quaternary ammonium group in the monolithic anion exchanger, the monolithic anion exchanger was treated with a hydrochloric acid aqueous solution to be a chloride type, and then the distribution state of chloride ions was observed by EPMA. As a result, it was confirmed that the chloride ions were uniformly distributed not only on the skeleton surface of the monolithic anion exchanger but also in the skeletons, and quaternary ammonium groups were uniformly introduced into the monolithic anion exchanger.

(Supporting of Platinum-Group Metal)

The above-mentioned monolithic anion exchanger was ion-exchanged into the C1 type, cut out into a cylindrical shape in the dry condition and dried under reduced pressure. A weight of the dried monolithic anion exchanger was 1.2 g. This monolithic anion exchanger of the dry condition was immersed in diluted hydrochloric acid in which 100 mg of palladium chloride was dissolved for 24 hours to be ion-exchanged into a palladium chloride acid type. After the end of the immersion, the monolithic anion exchanger was cleaned with pure water several times, and immersed in an hydrazine aqueous solution for 24 hours to be subjected to reduction treatment. While the palladium chloride acid-type monolithic anion exchanger was brown, the monolithic anion exchanger after the reduction treatment was colored black, indicating the production of palladium fine particles. The sample after the reduction was cleaned with pure water several times, and then dried under reduced pressure.

When the amount of supported palladium was obtained by ICP emission spectroscopy, the amount of supported palladium was 3.9% by weight. In order to check the distribution state of the palladium supported on the monolithic anion exchanger, the distribution state of the palladium was observed by EPMA. It was confirmed that the palladiums were uniformly distributed not only on the skeleton surface of the monolithic anion exchanger but also in the skeletons, and distributed relatively uniformly while the concentration was slightly higher inside. In order to measure the average particle size of the supported palladium particles, observation was carried out by a transmission electron microscope (TEM). The average particle size of the supported palladium fine particles was 8 nm.

EXAMPLES

Hereinafter, measurement results obtained by treating the substrate W with the substrate treatment equipment 1 will be described.

[Substrate to be Treated (Sample)]

Test wafers obtained by depositing copper, molybdenum and tungsten thin films to be 200 nm on a 4-inch silicon wafer, respectively, through sputtering were used. In the meantime, copper and tungsten thin films were deposited after previously depositing 50 nm of titanium as a base by sputtering. In recent years, in addition to tungsten or copper, molybdenum has been used as a wiring material of a MOS-type device and thus was also evaluated.

[Evaluation Method]

The sheet resistances before and after the cleaning treatment were measured using a 4-point probe sheet resistance measurement device (Σ-5+, NPS Inc.) and a difference thereof was recorded. When metal is eluted and the film thickness is thus reduced, the sheet resistance increases.

[Substrate Treatment Device (Cleaning Device)]

As the substrate treatment equipment (cleaning equipment), the single wafer substrate treatment equipment 1 of FIG. 2 was used. The inert gas was the nitrogen gas (99.999%), the number of rotations of the wafer was constant to be 500 rpm, and the treatment water was supplied from the treatment solution nozzle for 60 minutes to clean the test wafer.

[Raw Water (Ultrapure Water)]

Used ultrapure water was the secondary pure water of an ultrapure water production equipment installed in R&D center of ORGANO CORPORATION. The water quality at an outlet of the ultrapure water production equipment is as shown in Table 1 below. The outlet of the ultrapure water production equipment corresponds to the outlet 9b of the ultrapure water circulation pipe 9a of the subsystem 9 shown in FIG. 3, for example, the outlet 9b and the ultrapure water inlet 1a of the substrate treatment equipment 1 were connected therebetween by about 50 m of the pipe (pipe and joint made of PFA), and the concentration of dissolved oxygen at the ultrapure water inlet 1a was 8 μg/L.

TABLE 1

| Resistivity | 18.2 MΩ · cm |
|---|---|
| Total organic carbon concentration | 1 μg/L or less |
| Number of fine particles | 1/mL or less |
| | (particle size of 0.05 μm or greater) |
| Number of viable bacteria | 0.1/L or less |
| Silica | 0.1 μgSiO$_2$/L or less |
| Sodium | 5 ng/L or less |
| Iron | 5 ng/L or less |
| Copper | 5 ng/L or less |
| Chloride ion | 5 ng/L or less |
| Oxidation-reduction potential | +300 mV (vs. NHE) |
| Dissolved oxygen concentration | 2 μg/L or less |
| Hydrogen peroxide concentration | 16 to 17 μg/L |
| Water temperature | 23° C. |

[Treatment Water to be Evaluated]

The hydrogen peroxide-removed water was obtained by passing the above-mentioned ultrapure water through the palladium-supported monolith. At this time, the concentration of hydrogen peroxide was 2 μg/L or less.

The hydrogen-dissolved water was obtained by adding hydrogen to the above-mentioned ultrapure water through a hollow fiber membrane. The concentration of dissolved hydrogen was measured using a dissolved-hydrogen meter (DHDI-1, DKK-TOA CORPORATION. The hydrogen concentration was controlled by controlling an amount of the hydrogen gas to be supplied to the hollow fiber membrane with a mass flow controller.

The water from which the oxygen and the hydrogen peroxide have been removed was obtained by passing the above-mentioned hydrogen-dissolved water through the palladium-supported monolith. At this time, the palladium-supported monolith was disposed on the ultrapure water supply path within 5 m upstream of the ultrapure water (solution to be treated) inlet 1a of the substrate treatment equipment 1 between the outlet 9b of the ultrapure water circulation pipe 9a of the subsystem 9 shown in FIG. 3 and the ultrapure water inlet 1 of the substrate treatment equipment 1. The concentration of dissolved oxygen was measured using Model 410 of ORBISPHERE CORPORATION LIMITED.

Example 1

At a state where the concentration of oxygen gas in the treatment chamber of the single wafer cleaning equipment was regulated to 2% or less, the above-mentioned test wafers were treated while changing the type of the treatment water. Table 2 shows a result (increase in sheet resistance).

TABLE 2

| | Concentration | | | Sheet resistance increase (mΩ) | |
|---|---|---|---|---|---|
| Treatment water | Oxygen | Hydrogen peroxide | Hydrogen | Copper | Molybdenum |
| Ultrapure water | 8 | 17 | 0 | 5.0 | 22 |
| Hydrogen peroxide-removed water | 25 | <2 | 0 | 4.5 | 8 |
| Hydrogen-dissolved water | 9 | 16 | 95 | 2.8 | 7 |
| Water from which oxygen and hydrogen peroxide have been removed (hydrogen was added) | <2 | <2 | 8 | 1.5 | 2 |
| | <2 | <2 | 15 | <1 | 2 |
| | <2 | <2 | 66 | <1 | <1 |
| | <2 | <2 | 120 | <1 | <1 |

The copper was corroded in the ultrapure water or the hydrogen peroxide-removed water. In the hydrogen-dissolved water, the corrosion of copper was not completely suppressed. The removal of the dissolved oxygen and the hydrogen peroxide from the ultrapure water did not still completely suppress the corrosion.

However, when the water obtained by removing the dissolved oxygen and the hydrogen peroxide from the ultrapure water and adding a predetermined concentration or higher of hydrogen was used to clean the substrate in the low-oxygen atmosphere, the corrosion of copper could be completely suppressed. This was the same for the test wafer having the film of tungsten formed on the surface thereof (this is not shown in Table 2).

From the evaluation result of FIG. 2, it can be seen that when the wafer having copper exposed on the surface was cleaned with the ultrapure water, copper was corroded and eluted by the oxygen and hydrogen peroxide included in the ultrapure water.

Therefore, it can be seen that when the oxygen and hydrogen peroxide have been removed from the ultrapure water, the elution of copper (decrease in the film thickness) was suppressed, and when the hydrogen was added to the ultrapure water from which the oxygen and hydrogen peroxide have been removed, the elution of copper could be further suppressed.

It can be seen from Table 2 that the treatment water of copper of which the concentration of dissolved oxygen is adjusted to 2 μg/L or less, the concentration of hydrogen peroxide is adjusted to 2 μg/L or less, and the concentration of dissolved hydrogen is adjusted to 8 μg/L or higher, preferably 15 μg/L or higher, more preferably 66 μg/L or higher is most effective.

Also, it can be seen from Table 2 that when treating the test wafer having the film of molybdenum formed on the surface thereof, it was possible to considerably suppress the molybdenum corrosion by removing the hydrogen peroxide from the ultrapure water. At this time, the increase in sheet resistance is substantially the same as the case of the hydrogen-dissolved water. Further, when the water obtained by adding a predetermined concentration or higher of hydrogen to the hydrogen peroxide-removed water was used to treat the molybdenum-exposed substrate in the low-oxygen atmosphere, it was possible to lower the sheet resistance to a detection limit or less.

It can be seen from the evaluation result of Table 2 that the treatment water of molybdenum of which the concentration of hydrogen peroxide is preferably 2 μg/L or less, the concentration of dissolved oxygen is adjusted to 2 μg/L or less, the concentration of hydrogen peroxide is adjusted to 2

µg/L or less, and the concentration of dissolved hydrogen is adjusted to 8 µg/L or higher, preferably 15 µg/L or higher, more preferably 66 µg/L or higher is most effective.

Reference Example 1

The test wafer having the film of molybdenum formed on the surface thereof was immersed in the above-mentioned ultrapure water for 24 hours and then the concentration of hydrogen peroxide in the ultrapure water was measured. Table 3 shows a result. It was found that when molybdenum contacts the oxygen, the hydrogen peroxide is produced. Therefore, it is significant that the solution obtained by removing the hydrogen peroxide from the ultrapure water is used as the treatment solution of molybdenum.

TABLE 3

| | Concentration of hydrogen peroxide (µg/L) | |
|---|---|---|
| Dipping conditions | Before the immersion | After the immersion |
| Atmosphere of nitrogen 80% + oxygen 20% | 17 | 230 |
| Nitrogen atmosphere | 17 | 17 |

Example 2

The concentration of oxygen gas in the treatment chamber of the single wafer cleaning equipment was adjusted, the water from which the oxygen and hydrogen peroxide have been removed was used, and the test wafer was treated under the adjusted concentration of oxygen gas. Table 4 shows a result.

TABLE 4

| | Concentration (µg/L) | | | Sheet resistance increase (mΩ) | |
|---|---|---|---|---|---|
| Oxygen gas concentration | Oxygen | Hydrogen peroxide | Hydrogen | Copper | Molybdenum |
| 10% | <2 | <2 | 66 | 12 | 38 |
| 5% | <2 | <2 | 66 | 3.2 | 3 |
| 2% | <2 | <2 | 66 | <1 | <1 |
| 0.5% | <2 | <2 | 66 | <1 | <1 |

When the concentration of oxygen gas in the treatment chamber for performing the treatment of Example 2 was adjusted to 2% or less, it was possible to completely suppress the copper corrosion. This was the same for the test wafer having the film of molybdenum formed on the surface thereof.

From the evaluation result, it can be seen that when the oxygen and the hydrogen peroxide are removed from the ultrapure water, the treatment water obtained by adding the hydrogen to the ultrapure water from which the oxygen and the hydrogen peroxide have been removed is used and the concentration of oxygen gas in the treatment chamber for performing the substrate treatment with the treatment water is adjusted to 2% or less, it is possible to completely suppress the elution of copper or molybdenum exposed on the substrate surface.

Therefore, it can be said that the configuration of providing the catalytic unit 21 and the separation film unit 22, like the substrate treatment equipment 1 of the respective aspects, is effective to completely suppress the copper or molybdenum elution.

Example 3

The test wafer was the molybdenum-exposed substrate, the gas components in the cleaning chamber of the single wafer cleaning equipment were adjusted, the water from which the hydrogen peroxide has been removed was used, the test wafer was treated under the atmosphere of the adjusted gas components, and then a contact angle of the substrate surface was measured. Table 5 shows a result.

TABLE 5

| Gases in cleaning chamber | Concentration (µg/L) | | | Contact angle |
|---|---|---|---|---|
| | Oxygen | Hydrogen peroxide | Hydrogen | |
| Air | 8 | 20 | 0 | 16° |
| Air | 8 | <2 | 0 | 26° |
| Nitrogen (99.99%) | 8 | 20 | 0 | 19° |
| Nitrogen (99.99%) | 8 | <2 | 0 | 37° |

From the evaluation result, it can be seen that the substrate treated with the ultrapure water from which the hydrogen peroxide has been removed has the greater contact angle, as compared to the substrate treated with the ultrapure water including the hydrogen peroxide. That is, the surface becomes more hydrophobic. It is thought that the corresponding effect results from the suppression of the substrate surface oxidation by the hydrogen peroxide. Also, the substrate treated under the nitrogen atmosphere has the greater contact angle, as compared to the substrate treated with the air atmosphere. That is, the surface becomes more hydrophobic. It is thought that the corresponding effect results from the suppression of the substrate surface oxidation by the oxygen included in the air.

It can be said that it is possible to suppress the unexpected oxidation reaction of the molybdenum-exposed substrate by the removal of the hydrogen peroxide from the ultrapure water and/or the treatment under the atmosphere in which the concentration of oxygen has been reduced.

Reference Example 2

The test wafer was an n-type silicon wafer, and the contact angle was measured while changing the conditions of the treatment water of Example 3. Specifically, the gas components in the cleaning chamber of the single wafer cleaning equipment were adjusted, the test wafer was treated with the water from which the hydrogen peroxide has been removed and the water in which 50 µg/L of the hydrogen peroxide was added, respectively, under the atmosphere of the adjusted gas components and then the contact angle of the substrate surface was measured. Table 6 shows a result.

TABLE 6

| Gas in cleaning chamber | Concentration (µg/L) | | | Contact angle |
|---|---|---|---|---|
| | Oxygen | Hydrogen peroxide | Hydrogen | |
| Air | 8 | 50 | 0 | 84° |
| Air | 8 | <2 | 0 | 86° |
| Nitrogen (99.99%) | 8 | 50 | 0 | 87° |
| Nitrogen (99.99%) | 8 | <2 | 0 | 89° |

From the evaluation results, it can be seen that the substrate treated with the ultrapure water from which the hydrogen peroxide has been removed has the greater contact angle, as compared to the substrate treated with the ultrapure water including the hydrogen peroxide. That is, the surface becomes more hydrophobic. It is thought that the corresponding effect results from the suppression of the substrate surface oxidation by the hydrogen peroxide. Also, the substrate treated under the nitrogen atmosphere has the greater contact angle, as compared to the substrate treated with the air atmosphere. That is, the surface becomes more hydrophobic. It is thought that the corresponding effect results from the suppression of the substrate surface oxidation by the oxygen included in the air.

It can be seen that the removal of the hydrogen peroxide from the ultrapure water and/or the treatment under the atmosphere in which the concentration of oxygen has been reduced influences the wettability of the silicon substrate, i.e., the oxidation state.

Example 4

In the below, the evaluation result obtained when the substrate was treated with the dilute chemical solution is described. In Example 4, the substrate treatment equipment 1 of the aspect shown in FIG. 13 was used. The equipment is substantially the same as the substrate treatment equipment of the aspect shown in FIG. 5, and the same constitutional elements as those in FIG. 5 are denoted with the same reference numerals.

The configurations changed or added with respect to the aspect shown in FIG. 5 are as follows. An exhaust gas pipe 212 having an exhaust gas valve 211 is connected to an upper part of the chemical solution tank 56. Two level sensors 210 configured to monitor upper and lower limits of a liquid surface level are disposed on sidewalls of the chemical solution tank 56. The treatment solution supply pipe 27 extending between the membrane separation unit 22 and the mixing part 52 is interposed with a treatment solution valve 213 and a flowmeter 214. In addition, the treatment solution supply pipe 27 extending from the treatment solution valve 28 into the support shaft 20 of the treatment chamber 2 is connected with three pipes for measurement 215, 216, 217. The pipe for measurement 215 is interposed with a pH meter 218, the pipe for measurement 216 is interposed with a conductivity meter 219, and the pipe for measurement 217 is interposed with a concentration meter of dissolved oxygen 220. The treatment solution valve 28, the chemical solution valve 54, the pump 57, the treatment solution valve 213 and the flowmeter 214 are configured to be controlled by the control unit 5.

Figure 13:
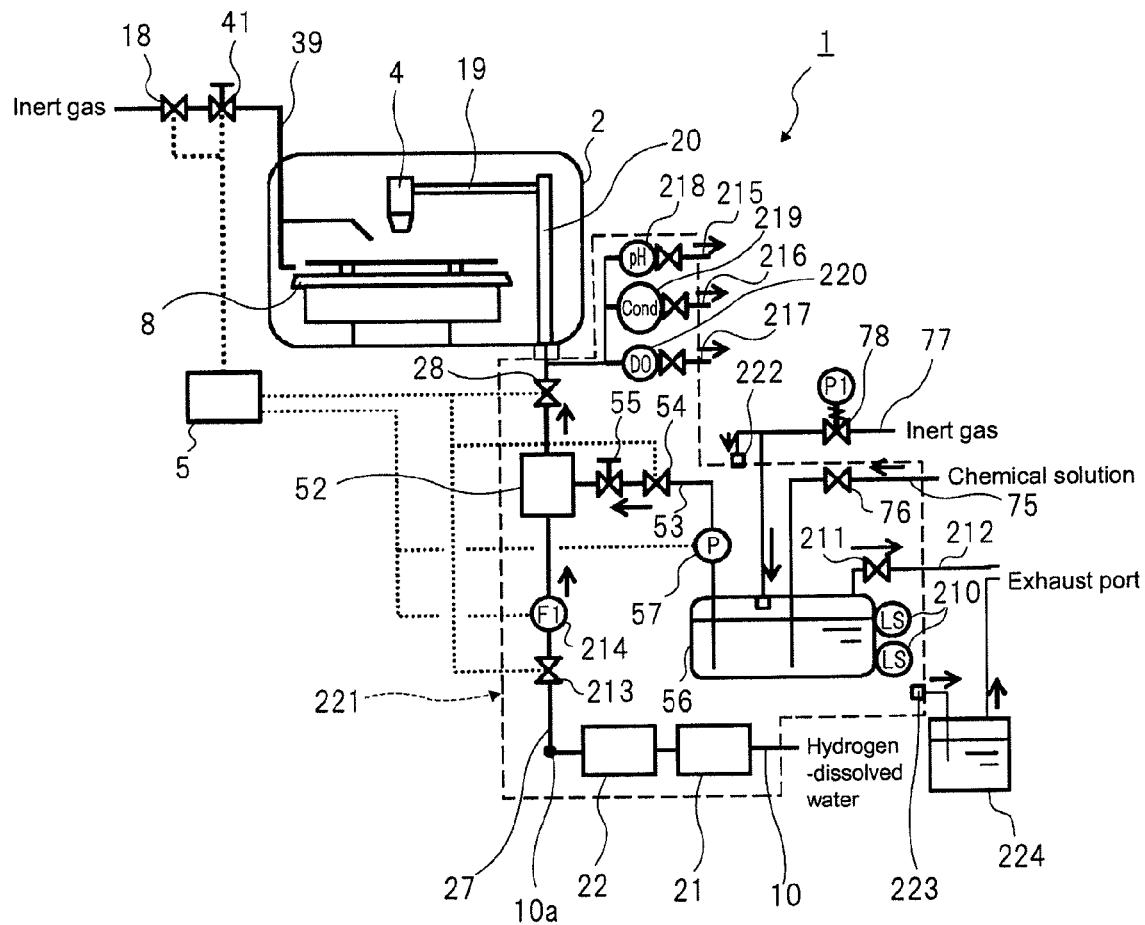
FIG. 13 depicts a substrate treatment equipment according to the third embodiment based on the aspect of FIG. 5.

In addition, the pipes (the treatment solution supply pipe 27, a part of the main pipe 10, the chemical solution supply pipes 53, 75, the exhaust gas pipes 212, the pipes for measurement 215, 216, 217, and the like) directly or indirectly connected to the treatment chamber 2 and the chemical solution tank 56 are disposed in an inert gas seal chamber 221, as shown in FIG. 13. The inert gas seal chamber 221 is formed on its surrounding wall with an inert gas introduction port 222 and an inert gas exhaust port 223, and the inert gas seal chamber 221 is airtightly sealed except for the ports. The inert gas introduction port 222 is connected with a branched pipe from the inert gas supply pipe 77. While discharging the inert gas from the inert gas exhaust port 223 towards the exhaust port, the inert gas is passed through the liquid in the transparent tank 224 and is thus bubbled, so that the inert gas is introduced into the inert gas seal chamber 221.

The substrate treatment equipment 1 of the above-mentioned aspect was prepared, the chemical solution tank 56 made of PP and having a volume of 1 L was filled with ammonia water (25% $NH_3$) serving as the chemical solution, and the nitrogen gas (purity 99.999%) serving as the inert gas was supplied to a gas phase part in the chemical solution tank 56 by the inert gas supply pipe 77. Before filling the chemical solution tank 56 with the ammonia water, the air in the empty chemical solution tank 56 was replaced with nitrogen in advance by using the nitrogen gas so as to exclude influences of the atmosphere and the like in the chemical solution tank 56.

The exhaust gas valve 211 of the exhaust gas pipe 212 connected to the upper part of the chemical solution tank 56 was opened, and the nitrogen gas was continuously supplied at the flow rate of 5 L/minute for 4 minutes. After 4 minutes, the exhaust gas from the exhaust port of the exhaust gas pipe 212 was taken into a plastic bag in which an oxygen monitor sensor has been inserted in advance and the concentration of oxygen of 0.02% to 0.03% was measured. As the oxygen monitor, a low-concentration oxygen monitor JKO-02LJD3 (JIKCO Ltd.) was used.

When supplying the nitrogen gas after filling the chemical solution tank 56 with the ammonia water, the supply was controlled by the gas supply pressure. The pressure was adjusted to 5 kPa. Any pressure may be used inasmuch as it does not interrupt the operation of pumping out the chemical solution from the chemical solution tank 56 by the pump 53.

The catalytic unit 21, the mixing part 52 and the chemical solution tank 56, the pipes connecting these components and the pipe components are accommodated in the inert gas seal chamber 221, and the pipe between the inert gas seal chamber 221 and the treatment chamber 2 has a dual structure having an inner pipe through which the treatment solution passes and an outer pipe configured to surround the inner pipe.

The nitrogen gas was supplied at the pressure of 5 kPa from the branched pipe of the inert gas supply pipe 77 to the space between the inner pipe and the outer pipe and to the inside of the inert gas seal chamber 221. The inert gas supply pipe 77 connected to the chemical solution tank 56 was used for supply of the nitrogen gas to the inert gas seal chamber 221. However, a separate inert gas supply pipe may be provided and the supply pressure of the nitrogen gas between the inert gas seal chamber 221 and the chemical solution tank 56 may have a different value. The purpose of supplying the nitrogen gas to the inert gas seal chamber 221, the chemical solution tank 56 and the like is to prevent the oxygen or the like from diffusing into the treatment solution. Therefore, the inert gas may be managed by a gas supply flow rate in place of the gas supply pressure.

As the liquid (water for dilution) to be mixed with the ammonia water by the mixing part 52, the ultrapure water described in [Raw Water] paragraph, the hydrogen peroxide-removed water described in [Treatment Water To Be Evaluated], the hydrogen-dissolved water, and the water from which the oxygen and hydrogen peroxide have been removed were used.

The dilute ammonia water diluted so that the concentration of ammonia water after the mixing became 0.19 mg $NH_3$/L (25% $NH_3$ was diluted by about 1366 times) had a conductivity of 2.0 μS/cm and pH 8.9. The corresponding water quality is desirable because it is possible to accomplish the charging prevention effect without adding carbonic acid to the water for dilution.

The flow rate of the dilute ammonia water having passed through the mixing part 52 was controlled to 2.1 L/minute, and the dilute ammonia water was continuously supplied to the concentration meter of dissolved oxygen 220, the conductivity meter 219 and the pH meter 218 at the flow rate of 200 mL/minute, respectively, and was supplied to the treatment chamber 2 at the flow rate of 1.5 L/minute.

Table 7 shows a result (increase in sheet resistance).

From Table 7, it can be seen that when the water for dilution was the hydrogen-dissolved water, it was not possible to completely suppress the corrosion of copper or molybdenum. That is, the corrosion is not suppressed even though the dissolved oxygen is simply removed from the ultrapure water.

However, when the ammonia water diluted by the water, which was obtained by removing the dissolved oxygen and the hydrogen peroxide from the ultrapure water and adding a predetermined concentration or higher of hydrogen, was used to treat the substrate in the low-oxygen atmosphere, it was possible to completely suppress the corrosion of copper and molybdenum.

TABLE 7

| Treatment water | Concentration (μg/L) | | | Conductivity (μS/cm) | pH | Sheet resistance increase (mΩ) | |
| --- | --- | --- | --- | --- | --- | --- | --- |
| | Oxygen | Hydrogen peroxide | Hydrogen | | | copper | molybdenum |
| Ammonia water diluted with ultrapure water | 14 | 17 | 0 | 2.0 | 8.9 | 7.4 | 24 |
| Ammonia water diluted with hydrogen peroxide-removed water | 31 | <2 | 0 | 2.0 | 8.9 | 7.4 | 8 |
| Ammonia water diluted with hydrogen-dissolved water | 15 | 17 | 95 | 2.0 | 8.9 | 5.0 | 10 |
| Ammonia water diluted with water from which oxygen and hydrogen peroxide have been removed | <2 | <2 | 8 | 2.0 | 8.9 | 3.5 | 6 |
| | <2 | <2 | 15 | 2.0 | 8.9 | 3.2 | 4 |
| | <2 | <2 | 66 | 2.0 | 8.9 | 3.2 | 3 |
| | <2 | <2 | 120 | 2.0 | 8.9 | 3.0 | 3 |

Example 5

In the below, a measurement result obtained by the substrate treatment equipment (FIG. 12) of the fourth embodiment is described.

The dilute hydrofluoric acid solution was prepared by putting the 50% hydrofluoric acid solution and the ultrapure water into the mixed water storage tank 300, which was filled with the nitrogen gas (99.999%) serving as the inert gas, in a volume ratio of 1:100. The hydrogen gas was added to the dilute hydrofluoric acid solution through the hollow fiber membrane, and the solution was passed through the palladium-supported monolith prepared as the oxidant removal equipment 306 to remove the oxygen and hydrogen peroxide and was then introduced into the treatment chamber 2 of the substrate treatment equipment, in which the concentration of oxygen gas was kept at 2% or less, to clean the test wafer.

The treatment chamber 2 of the substrate treatment equipment was a single wafer cleaning equipment (ZENKYO CORPORATION). The test wafer was a 4-inch silicon wafer on which a copper film of 200 nm was formed.

Also, the test was carried out for a case where hydrogen was not added and a case where the solution was not passed through the palladium-supported monolith. The sheet resistances of the test wafer before and after the cleaning were measured, and an increase thereof was calculated. In the meantime, the concentration of dissolved oxygen and the concentration of dissolved hydrogen were measured just before the treatment chamber. Table 8 shows a result. The measurement device for each measurement has been described above.

TABLE 8

| Treatment water | Concentration (μg/L) | | | Sheet resistance increase (mΩ) |
| --- | --- | --- | --- | --- |
| | Oxygen | Hydrogen peroxide | Hydrogen | |
| Only hydrogen addition (no passage through oxidant removal equipment) | 24 | 15 | 15 | 3.7 |
| Only passage through oxidant removal equipment (no hydrogen addition) | 22 | <2 | <2 | 3.2 |
| Hydrogen addition and passage through oxidant removal equipment | <2 | <2 | 8 | 1.2 |
| Hydrogen addition and passage through oxidant removal equipment | <2 | <2 | 15 | <1 |

When the hydrogen was just added or when the passage through the oxidant removal equipment was just made without adding the hydrogen, copper was corroded. However, it is clear that when the substrate was treated with the dilute hydrofluoric acid obtained by adding 8 μg/L or more of hydrogen to the dilute hydrofluoric acid and adjusting the concentration of dissolved oxygen to 2 μg/L or less and the concentration of hydrogen peroxide to 2 μg/L or less, the copper corrosion was substantially suppressed. Also, when the concentration of dissolved hydrogen was further adjusted to 5 μg/L, the copper corrosion was completely suppressed.

Example 6

The same test as Example 5 was carried out while adjusting the concentration of oxygen gas in the treatment chamber 2 of the single wafer cleaning equipment. Table 9 shows a result.

TABLE 9

| Oxygen gas concentration in treatment chamber | Concentration (μg/L) | | | Sheet resistance increase (mΩ) |
| --- | --- | --- | --- | --- |
| | Oxygen | Hydrogen peroxide | Hydrogen | |
| 10% | <2 | <2 | 15 | 3.5 |
| 5% | <2 | <2 | 15 | 2.2 |
| 2% | <2 | <2 | 15 | <1 |
| 0.5% | <2 | <2 | 15 | <1 |

When the concentration of oxygen gas in the treatment chamber 2 was adjusted to 2% or less, the copper corrosion could be completely suppressed. From the evaluation result, it can be seen that when treating the substrate by using the treatment solution obtained by adding hydrogen to the dilute hydrofluoric acid and passing the solution through the oxidant removal equipment to remove the oxygen and hydrogen peroxide therefrom, it is possible to completely suppress the elution of copper exposed on the substrate surface by adjusting the concentration of oxygen gas in the treatment chamber to 2% or less.

As described above, although the disclosure has been described with reference to the embodiments, the disclosure is not limited thereto and can be diversely changed and implemented without departing from the technical spirit thereof.

The present application claims the priorities based on Japanese Patent Application No. 2013-198535 filed on Sep. 25, 2013, Japanese Patent Application No. 2013-198549 filed on Sep. 25, 2013, Japanese Patent Application No. 2013-206447 filed on Oct. 1, 2013, and Japanese Patent Application No. 2014-097459 filed on May 9, 2014, the contents of which being herein incorporated for reference.

The invention claimed is:

1. A method for manufacturing a substrate treatment equipment comprising a plurality of treatment chambers in each of which a substrate is to be disposed and to each of which a substrate treatment solution for washing and immersing the substrate is to be supplied, a main pipe having an upstream end connected to an ultrapure water circulation pipe of a subsystem of an ultrapure water production equipment, the subsystem including a non-regenerative ion-exchange equipment, and a plurality of treatment solution supply pipes each having an upstream end connected to the main pipe and a downstream end connected to each of the plurality of treatment chambers, the method comprising:
installing a catalytic unit at a location, through which a hydrogen-dissolved solution prepared by adding hydrogen to ultrapure water is to pass, on at least one treatment solution supply pipe of the plurality of treatment solution supply pipes or in at least one treatment chamber of the plurality of treatment chambers, so that a hydrogen-dissolved treatment solution obtained by passing the hydrogen-dissolved solution through a platinum-group metal catalyst is supplied as the substrate treatment solution into the at least one treatment chamber, wherein the catalytic unit is filled with a platinum-group metal catalyst obtained as a result of supporting a palladium catalyst on a monolithic organic porous anion exchanger.

* * * * *